(12) United States Patent
Nakatani

(10) Patent No.: US 6,781,188 B2
(45) Date of Patent: Aug. 24, 2004

(54) NONVOLATILE SEMICONDUCTOR MEMORY DEVICE

(75) Inventor: Yasuo Nakatani, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/153,738

(22) Filed: May 24, 2002

(65) Prior Publication Data

US 2003/0098485 A1 May 29, 2003

(30) Foreign Application Priority Data

Nov. 27, 2001 (JP) ........................................ 2001-360842

(51) Int. Cl.$^7$ ............................................. H01L 29/68
(52) U.S. Cl. ........................ 257/316; 257/315; 257/365; 365/185.22; 365/185.28; 438/258; 438/263
(58) Field of Search ................................ 257/315, 316, 257/365, 321; 365/185.22, 185.28; 438/258, 263

(56) References Cited

U.S. PATENT DOCUMENTS 5,102,814 A * 4/1992 Woo ............................ 438/263
5,773,861 A * 6/1998 Chen et al. .................. 257/316
5,886,927 A * 3/1999 Takeuchi ................ 365/185.22
5,994,733 A 11/1999 Nishioka et al.
6,331,724 B1 * 12/2001 Chen et al. .................. 257/365

FOREIGN PATENT DOCUMENTS

| JP | 7-297301 | 11/1995 |
|----|----------|---------|
| JP | 11-17035 | 1/1999 |

* cited by examiner

*Primary Examiner*—David Nelms
*Assistant Examiner*—Dao H. Nguyen
(74) *Attorney, Agent, or Firm*—McDermott Will & Emery LLP

(57) ABSTRACT

Disclosed is a nonvolatile semiconductor memory device in which a disturbance phenomenon can be prevented. A nonvolatile semiconductor memory device has a semiconductor substrate, and a floating gate electrode formed on the semiconductor substrate via a gate insulating film. The floating gate electrode includes a lower conductive layer formed on the gate insulating film and having a first width W1 in a channel width direction, and an upper conductive layer formed on the lower conductive layer and having a second width W2 wider than the first width W1 in the channel width direction.

4 Claims, 25 Drawing Sheets

NONVOLATILE SEMICONDUCTOR MEMORY DEVICE

BACKGROUND OF THE INVENTION

1. Field of the Invention

The present invention relates to a nonvolatile semiconductor memory device. More particularly, the invention relates to a nonvolatile semiconductor memory device having a floating gate element.

2. Description of the Background Art

For example, Japanese Patent Laying-Open No. 11-17035 discloses a conventional nonvolatile semiconductor memory device. FIG. 28 is a plan view of the conventional nonvolatile semiconductor memory device disclosed in the publication. FIG. 29 is a cross section taken along line XXIX—XXIX of FIG. 28. FIG. 30 is a cross section taken along line XXX—XXX of FIG. 28. FIG. 31 is a cross section taken along line XXXI—XXXI of FIG. 28.

Referring to FIG. 28, a memory region 500 and a peripheral region 600 are formed on a silicon substrate 401. In the memory region 500, bit lines 420 extend so as to perpendicularly cross control gate electrodes 410. In peripheral region 600, a plurality of gate electrodes 434 are formed, and an isolation oxide film 430 is positioned between gate electrodes 434. Memory region 500 in which a memory transistor is formed and peripheral region 600 in which a transistor having gate electrode 434 is formed are electrically isolated from each other by an LOCOS (Local Oxidation of Silicon) film 449.

Referring to FIGS. 29 and 30, memory region 500 is shown by cross sections of regions 200 and 300. A memory transistor has n-type impurity regions 413a and 413b as drain regions, an n-type impurity region 414 as a source region, a silicon oxide film 404, a floating gate electrode 407, an ONO (Oxide Nitride Oxide) film 408, a silicon oxide film 409, and control gate electrode 410.

Impurity regions 413a and 413b and impurity region 414 are formed in the surface of p-type silicon substrate 401 with a predetermined distance from each other. Floating gate electrode 407 is formed on regions sandwiched by impurity regions 413a and 413b and impurity region 414 via silicon oxide film 404.

Control gate electrode 410 is formed so as to extend over floating gate electrode 407 via ONO film 408 consisting of three layers of a silicon oxide film, a silicon nitride film, and a silicon oxide film, and silicon oxide film 409.

On silicon substrate 401, a bottom n-well 402 and a p-well 403 in contact with bottom n-well 402 are formed. A trench 405 is formed between floating gates 407 arranged in a predetermined direction, and a silicon oxide film 406 is formed so as to fill trench 405.

The upper end face of silicon oxide film 406 is positioned between the top face and bottom face of floating gate electrode 407. On silicon oxide film 406 and floating gate electrode 407, ONO film 408, silicon oxide film 409, control gate electrode 410, and a TEOS (Tetra Ethyl Ortho Silicate) oxide film 411 are formed.

A p-type pocket region 415 is formed so as to surround impurity region 414. On side walls of floating gate electrode 407, ONO film 408, silicon oxide film 409, control gate electrode 410, and TEOS oxide film 411, a side wall oxide film 412 is formed.

An interlayer insulating film 416 is formed over silicon substrate 401 so as to cover the memory transistor. In a part of interlayer insulating film 416, contact holes 417 reaching impurity regions 413a and 413b are formed. A doped polysilicon layer 420a is formed so as to fill the contact holes 417 and cover interlayer insulating film 416.

Bit line 420 constructed by doped polysilicon layer 420a which is in contact with interlayer insulating film 416 and a tungsten silicide layer 420b is formed. An interlayer insulating film 421 is formed so as to cover interlayer insulating film 416 and bit line 420. A silicon oxide film 422 is formed on interlayer insulating film 421, and an aluminum interconnection 423 is formed so as to be buried in silicon oxide film 422. A smooth coat film 424 is formed so as to be in contact with silicon oxide film 422 and aluminum interconnection 423 and, further, an aluminum interconnection 425 is formed on smooth coat film 424.

Referring to FIG. 31, peripheral region 600 is expressed by a region 800 shown in FIG. 31. Isolation oxide film 430 is formed in silicon substrate 401. A p-well 431 and an n-well 432 are formed by using isolation oxide film 430 as a border.

On p-well 431, a transistor having gate electrode 434, a silicon oxide film 433, and an n-type low-density impurity region 437 and an n-type high-density impurity region 438 serving as source/drain regions is formed. On n-well 432, a transistor having gate electrode 434, silicon oxide film 433, and a p-type low-density impurity region 439 and a p-type high-density impurity region 440 serving as source/drain regions is formed. A silicon oxide film 435 is formed on gate electrode 434, and a side wall oxide film 436 is formed on the side walls of gate electrode 434 and silicon oxide film 435.

Interlayer insulating films 416 and 421 are formed so as to cover the transistors. Contact holes 441 reaching silicon substrate 401 are formed in interlayer insulating films 416 and 421. A plug 442 is formed so as to fill contact hole 441. Aluminum interconnection 423 is formed so as to be buried in silicon oxide film 422 and to be in contact with interlayer insulating film 421 and plug 442. Smooth coat film 424 is formed on silicon oxide film 422, and an aluminum interconnection 443 is formed so as to be buried in smooth coat film 424. Aluminum interconnection 425 which is in contact with aluminum interconnection 443 is formed on smooth coat film 424.

FIGS. 32 and 33 are cross sections showing fabricating processes of the nonvolatile semiconductor memory device illustrated in FIG. 30. Referring to FIG. 32, on silicon substrate 401, bottom n-well 402, p-well 403, a silicon oxide film 463, doped polysilicon 464, and an ONO film 466 are sequentially formed. A silicon oxide film, doped polysilicon, a tungsten silicide layer, and a TEOS oxide film are formed so as to cover ONO film 466. A resist is applied so as to cover the TEOS oxide film and patterned in a predetermined shape, thereby forming a resist pattern 469. By etching the TEOS oxide film, tungsten silicide layer, doped polysilicon, and silicon oxide film by using resist pattern 469 as a mask, TEOS oxide film 411, control gate electrode 410, and silicon oxide film 409 are formed. After that, resist pattern 469 is removed.

Referring to FIG. 33, the whole silicon substrate 401 is covered with a resist, and the resist is patterned in a predetermined shape, thereby forming a resist pattern 470. By etching ONO film 466, doped polysilicon 464, and silicon oxide film 463 along resist pattern 470, ONO film 408, floating gate electrode 407, and silicon oxide film 404 are formed. After that, resist pattern 470 is removed.

Impurity regions 413a and 413b, pocket region 415, side wall oxide film 412, interlayer insulating film 416, bit line 420, interlayer insulating film 421, aluminum interconnection 423, silicon oxide film 422, smooth coat film 424, and aluminum interconnection 425 are sequentially formed, thereby completing the nonvolatile semiconductor memory device shown in FIG. 30.

In the method of fabricating the nonvolatile semiconductor memory device as described above, as shown in FIG. 33, the memory gate in which floating gate electrode 407 and control gate electrode 410 are overlapped with each other has a vertically-long shape. In an etching process, etching of floating gate electrode 407 positioned in the lowest layer needs high-precision dimensional control. Since the memory gate itself has the vertically-long shape, there is a problem such that the dimensional control is difficult. It is also difficult to prevent accumulation of an etching residue between neighboring floating gates 407. Consequently, it is difficult to fabricate floating gate electrode 407 with high precision.

The cross section of FIG. 29 is a cross section in the direction of the channel width of floating gate electrode 407. As the nonvolatile semiconductor memory device becomes finer, the distance in the channel width direction between the neighboring floating gate electrodes 407 is also shortened. When the distance in the channel width direction is shortened, a so-called disturbance phenomenon such that writing operation is performed also on the floating gate electrodes adjacent to the floating gate electrode to which data is to be written occurs. The phenomenon is apt to occur in an AND type nonvolatile semiconductor memory device in which an isolation oxide film does not appear in the cross section in the channel width direction.

SUMMARY OF THE INVENTION

The invention has been achieved to solve the problems as described above.

An object of the invention is to provide a nonvolatile semiconductor memory device whose floating gate electrode can be fabricated with high precision.

Another object of the invention is to provide a nonvolatile semiconductor memory device in which the disturbance phenomenon can be effectively prevented.

A nonvolatile semiconductor memory device according to an aspect of the invention has a semiconductor substrate, and a floating gate electrode formed on the semiconductor substrate interposed a gate insulating film therebetween. The floating gate electrode includes a lower conductive layer formed on the gate insulating film and having a first width in a channel width direction, and an upper conductive layer formed on the lower conductive layer and having a second width wider than the first width in the channel width direction.

In the nonvolatile semiconductor memory device constructed as described above, the lower conductive layer on the gate insulating film has the first width narrower than the second width of the upper conductive layer in the channel width direction. Consequently, the distance between neighboring floating gate electrodes is increased in the portion of the lower conductive layer. As a result, the lower conductive layer and the floating gate electrode of another nonvolatile transistor are insulated from each other with reliability, so that the disturbance phenomenon can be prevented.

Preferably, the nonvolatile semiconductor memory device further includes a control gate electrode formed on the floating gate electrode interposed a dielectric film therebetween.

Preferably, the control gate electrode has a third width narrower than the second width.

Preferably, the nonvolatile semiconductor memory device further includes a side wall insulating layer formed on the dielectric film so as to be in contact with a side wall of the control gate electrode. The width of the side wall insulating layer is narrowed with distance from the dielectric film. In this case, since the side wall insulating layer is formed on the side wall of the control gate electrode, the control gate electrode can be insulated from other conductive layers with reliability.

Preferably, the nonvolatile semiconductor memory device further includes a side wall conductive layer formed on the dielectric film so as to be in contact with a side wall of the control gate electrode. The width of the side wall conductive layer is narrowed with distance from the dielectric film. In this case, the side wall conductive layer is in contact with the side wall of the control gate electrode, so that the side wall conductive layer also functions as a control gate electrode. As a result, the cross sectional area of the control gate electrode becomes large, and electric resistance of the control gate electrode can be reduced.

Preferably, the nonvolatile semiconductor memory device further includes a first insulating film formed on the semiconductor substrate. The top face of the first insulating film and the top face of the lower conductive layer are almost flush with each other. In this case, since the top face of the lower conductive layer and the top face of the first insulating film are flush with each other, an upper conductive layer can be easily formed on the top faces.

Preferably, the upper conductive layer and the lower conductive layer are made of the same material. In this case, the adhesion of the lower and upper conductive layers is improved, so that a very reliable nonvolatile semiconductor memory device can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described hereinbelow with reference to the drawings.

First Embodiment

Figure 1:
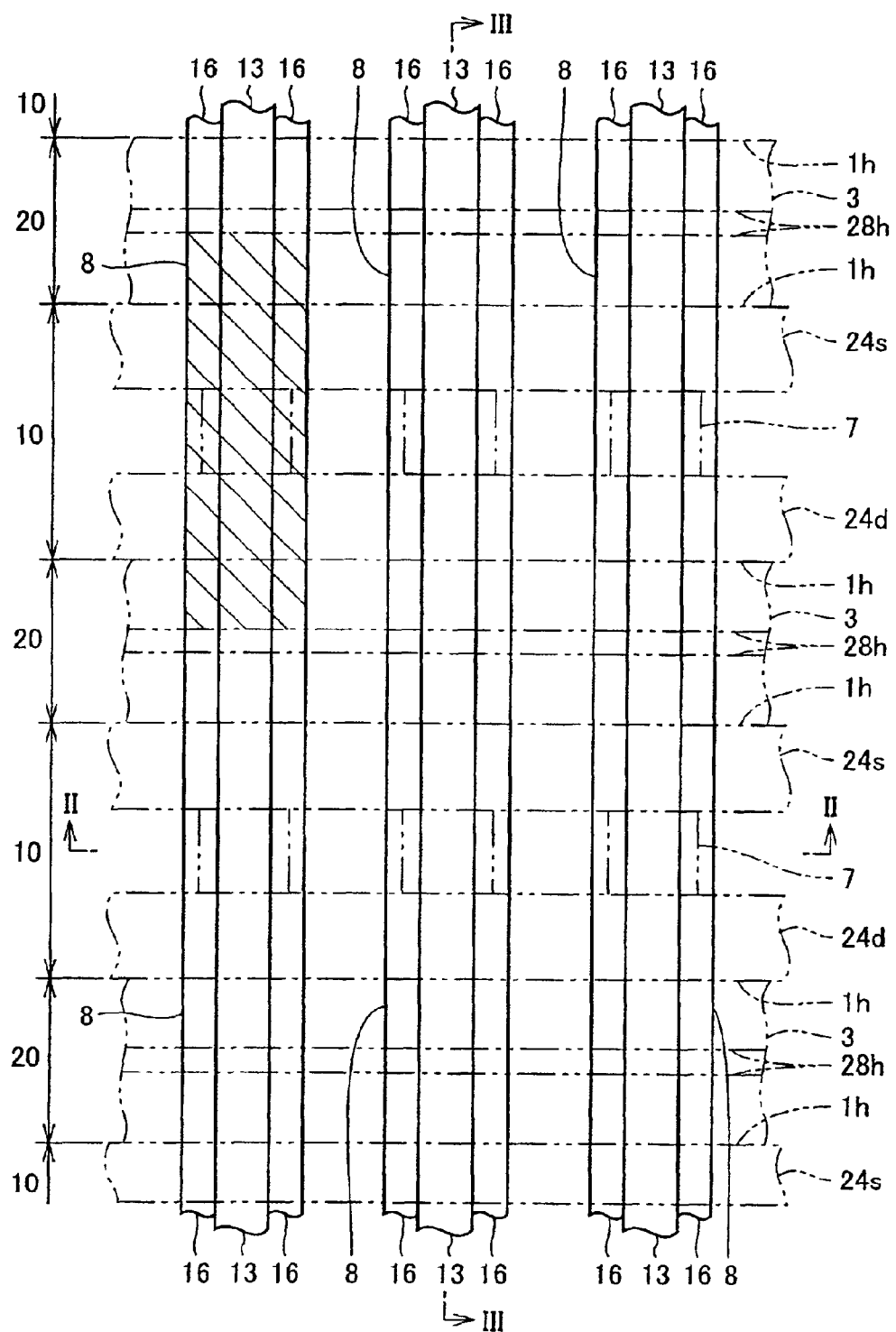
FIG. 1 is a plan view of a nonvolatile semiconductor memory device according to a first embodiment of the invention.

Referring to FIG. 1, a nonvolatile semiconductor memory device has a lower conductive layer 7 of a floating gate electrode formed on a semiconductor substrate, an upper conductive layer 8 of the floating gate electrode formed on lower conductive layer 7, and a control gate electrode 13 extending in the same direction as upper conductive layer 8.

On the semiconductor substrate, active regions 10 in which devices are formed and isolation regions 20 for isolating active regions 10 are formed. Active regions 10 and isolation regions 20 are formed so as to extend in parallel with each other. In active region 10, a source region 24s and a drain region 24d are formed so as to be apart from each other. Both source region 24s and drain region 24d are impurity regions. Between source region 24s and drain region 24d, lower conducive layer 7 of the floating gate electrode is formed. Lower conductive layer 7 is made of doped polysilicon and is conductive. Upper conductive layer 8 of the floating gate electrode is formed on lower conductive layer 7. Upper conductive layer 8 extends in the direction perpendicularly crossing the extending direction of source region 24s and drain region 24d and has an area wider than that of lower conductive layer 7.

Control gate electrodes 13 are formed so as to extend in the direction perpendicularly crossing source regions 24s and drain regions 24d. A side wall insulating layer 16 is formed on both sides of control gate electrode 13.

In isolation region 20, a trench 1h is formed in the silicon substrate, and an isolation oxide film 3 is embedded in trench 1h. Upper conductive layer 8 of the floating gate electrode is divided and isolated by trenches 28h.

Figure 2:
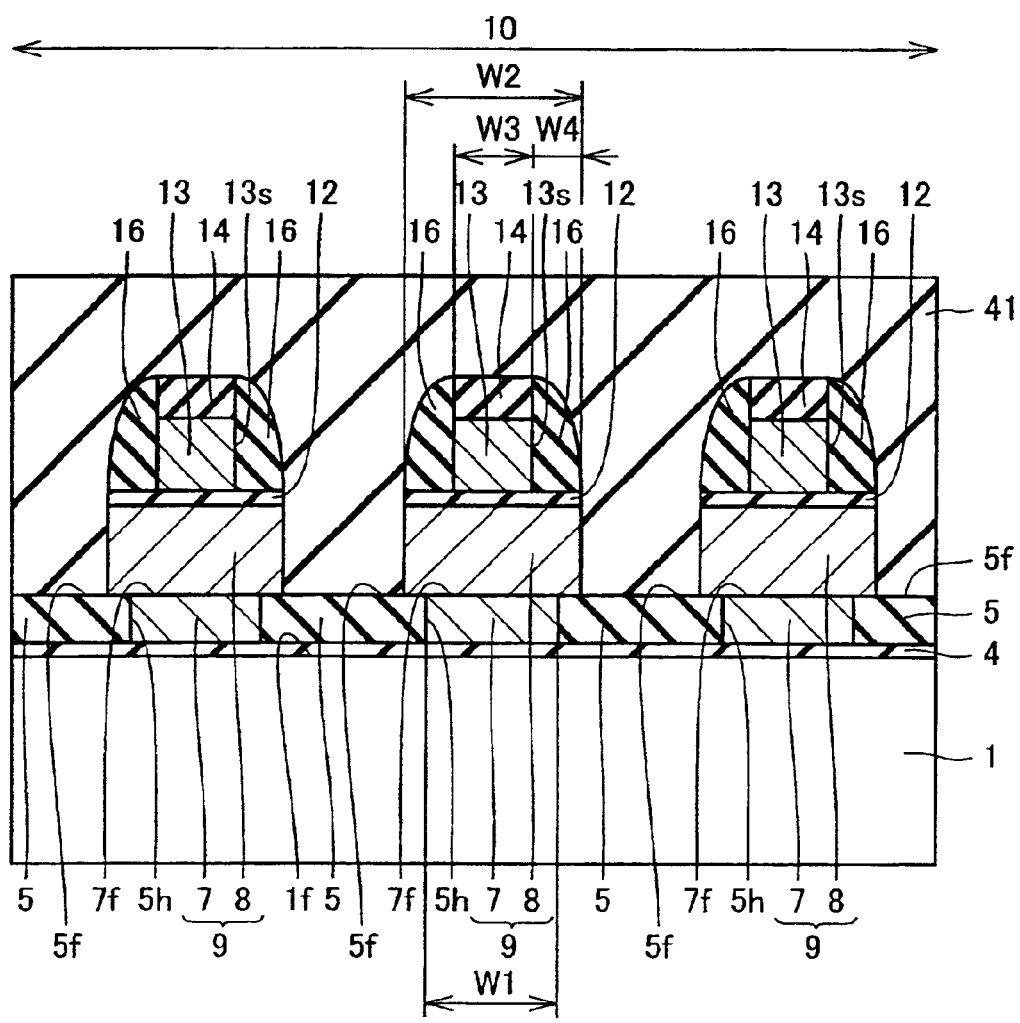
FIG. 2 is a cross section taken along line II—II of FIG. 1.

Referring to FIG. 2, the nonvolatile semiconductor memory device has a silicon substrate 1 as a semiconductor substrate, and a floating gate electrode 9 formed on silicon substrate 1 via a gate insulating film 4. Floating gate electrode 9 includes lower conductive layer 7 formed on gate insulating film 4 and having a first width W1 in the channel width direction and an upper conductive layer 8 formed on lower conductive layer 7 and having a second width W2 wider than the first width W1 in the channel width direction. The cross section of FIG. 2 is a cross section in the channel width direction.

The nonvolatile semiconductor memory device further has control gate electrode 13 formed on floating gate electrode 9 via a dielectric film 12. Control gate electrode 13 has a third width W3 narrower than second width W2. The nonvolatile semiconductor memory device further includes side wall insulating layer 16 formed on dielectric film 12 so as to be in contact with a side wall 13s of control gate electrode 13. The width of side wall insulating layer 16 is reduced with distance from dielectric film 12.

The nonvolatile semiconductor memory device further has an interlayer insulating film 5 as a first insulating film formed on silicon substrate 1. The top face 5f of interlayer insulating film 5 and the top face 7f of lower conductive layer 7 are almost flush with each other. Upper and lower conductive layers 8 and 7 are made of the same material which is doped polysilicon.

On the main face if of silicon substrate 1, gate insulating film 4 which is a silicon oxide film is formed. On gate insulating film 4, a plurality of lower conductive layers 7 are formed with a spacing. Interlayer insulating film 5 is formed so as to be in contact with lower conductive layer 7 and gate insulating film 4.

Upper conductive layer 8 is formed on the top face 7f of lower conductive layer 7 and the top face 5f of interlayer insulating film 5. Upper and lower conductive layers 8 and 7 construct floating gate electrode 9. Dielectric film 12 is formed on upper conductive layer 8. Dielectric film 12 has a three-layer structure of a silicon oxide film, a silicon nitride film, and a silicon oxide film.

Control gate electrode 13 is formed on dielectric film 12 so as to extend from this side of the drawing to the depth side. Control gate electrode 13 has side walls 13s. A mask layer 14 which is a silicon oxide film is formed on control gate electrode 13. Side wall insulating layer 16 in a side-wall spacer shape is formed on the side wall of control gate electrode 13. Side wall insulating layer 16 is narrowed with distance from dielectric film 12. The maximum width of side wall insulating layer 16 is W4. The widths W2, W3, and W4 have the relation of W2=W3+2W4. A second interlayer insulating film 41 as a second insulating film is formed so as to cover control gate electrode 13.

Figure 3:
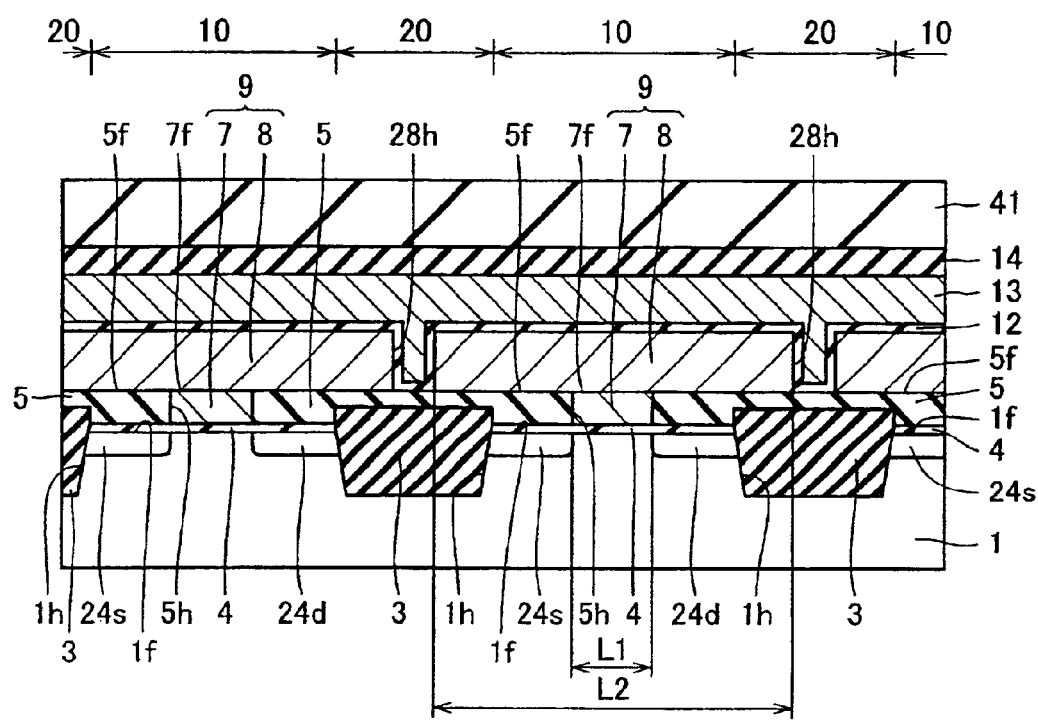
FIG. 3 is a cross section taken along line III—III of FIG. 1.

Referring to FIG. 3, in the cross section in the channel length direction, active regions 10 and isolation regions 20 are alternately formed on silicon substrate 1. In isolation region 20, trench 1h is formed in the surface of silicon substrate 1. Isolation oxide film 3 is formed so as to bury trench 1h.

In active region 10, source region 24s and drain region 24d are formed with a spacing therebetween on the surface of silicon substrate 1. Source region 24s and drain region 24d are an impurity region, and an impurity of a conduction type opposite to that of the impurity doped in silicon substrate 1 is doped.

Gate insulating film 4 is formed on the main surface if of silicon substrate 1. On gate insulating film 4, lower conductive layer 7 of floating gate electrode 9 is formed. Lower conductive layer 7 is formed between source region 24s and drain region 24d. On source region 24s and drain region 24d, first interlayer film 5 is formed via gate insulating film 4. Upper conductive layer 8 of floating gate electrode 9 is formed on the top face 7f of lower conductive layer 7 and the top face 5f of interlayer insulating film 5. Lower conductive layer 7 is formed in an opening 5h of first interlayer insulating film 5. Upper conductive layer 8 is electrically connected to lower conductive layer 7. Trenches 28h are formed in upper conductive layer 8, and neighboring upper conductive layers 8 are isolated from each other by trenches 28h.

Dielectric film 12 is formed on the surface of upper conductive layer 8. Control gate electrode 13 is formed on dielectric film 12 so as to extend in one direction. Mask layer 14 is formed on control gate electrode 13. On mask layer 14, interlayer insulating film 41 is formed.

A method of fabricating the nonvolatile semiconductor memory device shown in FIGS. 1 to 3 will now be described.

Figure 4:
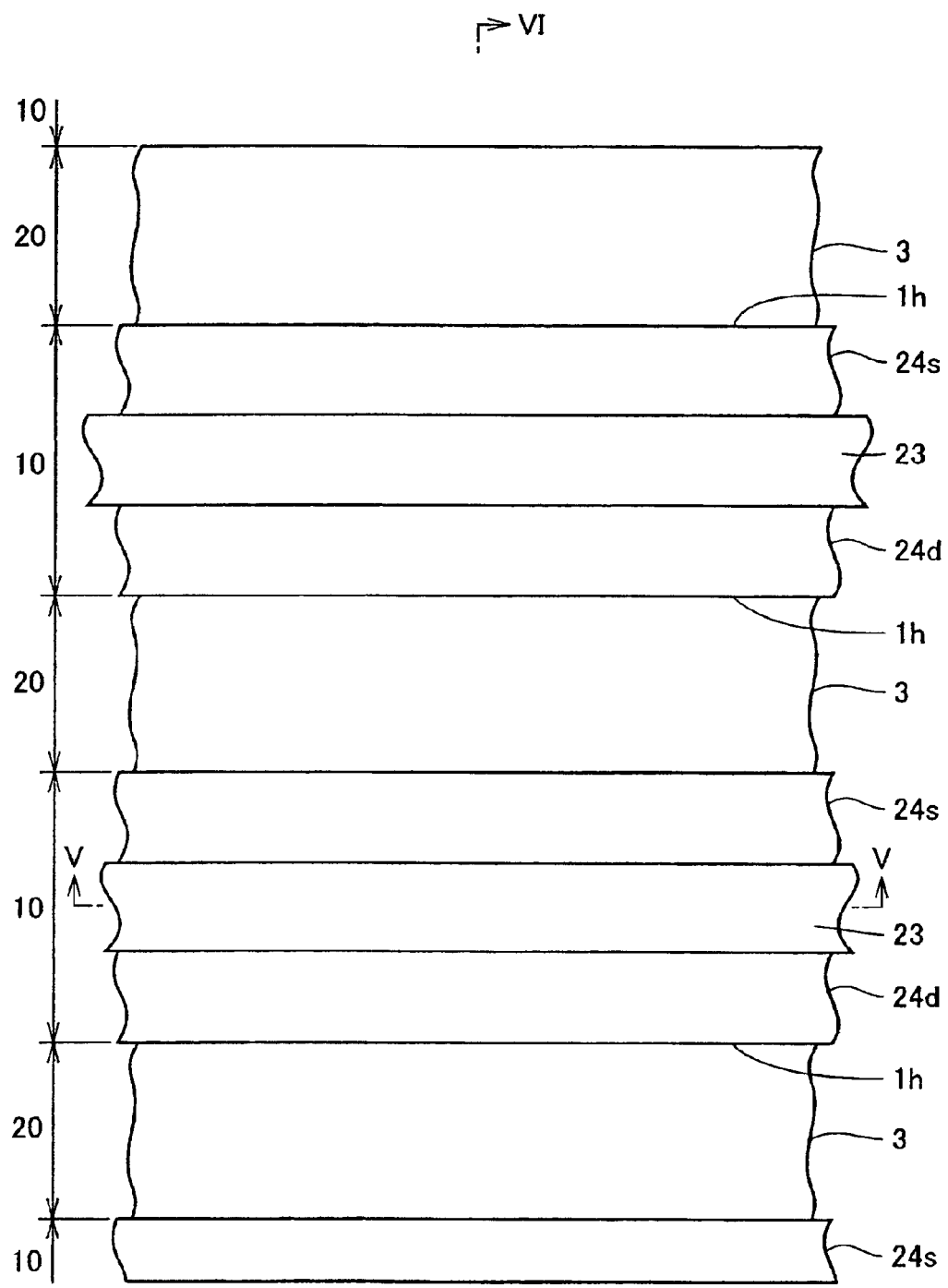
FIG. 4 is a plan view showing a first process of a method of fabricating the nonvolatile semiconductor memory device illustrated in FIGS. 1 to 3.
Figure 5:
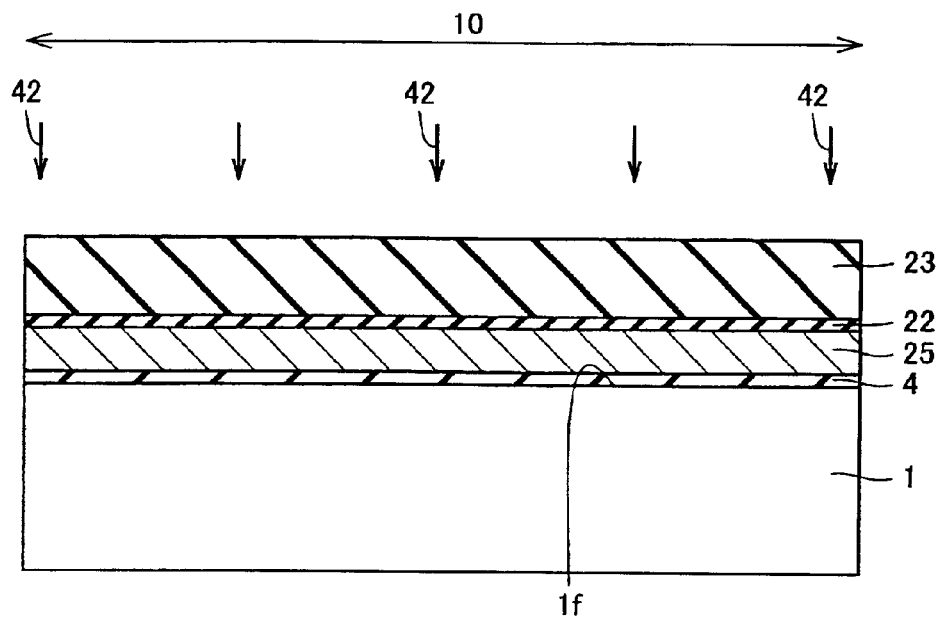
FIG. 5 is a cross section taken along line V—V of FIG. 4.
Figure 6:
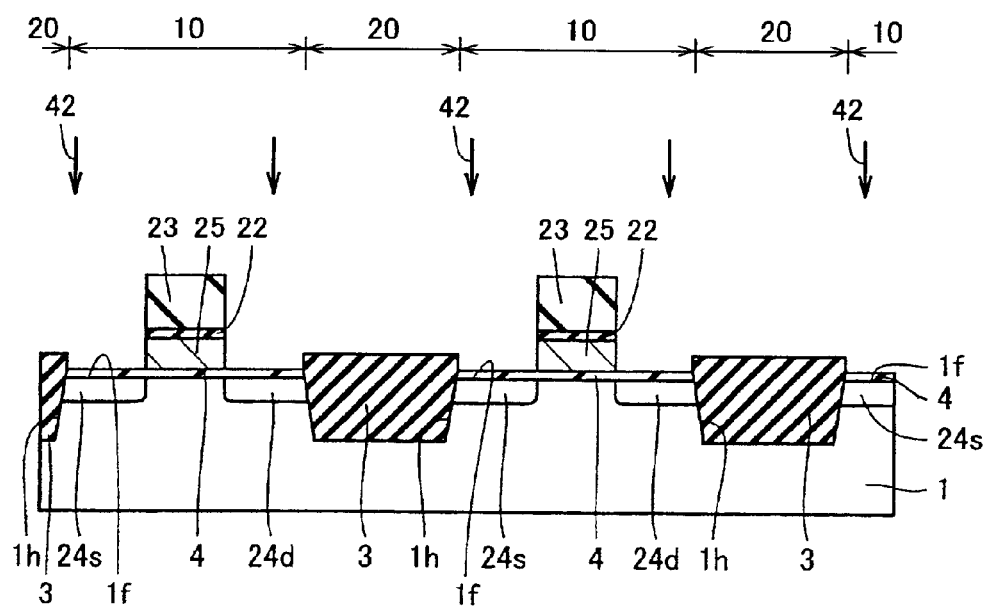
FIG. 6 is a cross section taken along line VI—VI of FIG. 4.

Referring to FIGS. 4 to 6, a mask layer (not shown) is formed on the main surface if of silicon substrate 1, and silicon substrate 1 is etched by using the mask layer as a mask, thereby forming trenches 1h in silicon substrate 1. Isolation oxide film 3 which is a silicon oxide film is formed so as to bury trenches 1h.

Gate insulating film 4 is formed by thermal oxidation on the main surface if of silicon substrate 1. On gate insulating film 4, the doped polysilicon film, dielectric film, and silicon nitride film are formed. A resist pattern is formed on the silicon nitride film. By etching the silicon nitride film, dielectric film, and doped polysilicon film in accordance with the resist pattern, a mask layer 23 made by the silicon nitride film, a silicon oxide film 22, and a band-shaped conductive layer 25 are formed. By using the mask layer 23 and band-shaped conductive layer 25 as a mask, impurity ions are implanted to the surface of silicon substrate 1 from the direction shown by the arrows 42. By the operation, source region 24s and drain region 24d are formed on both sides of band-shaped conductive layer 25.

Figure 7:
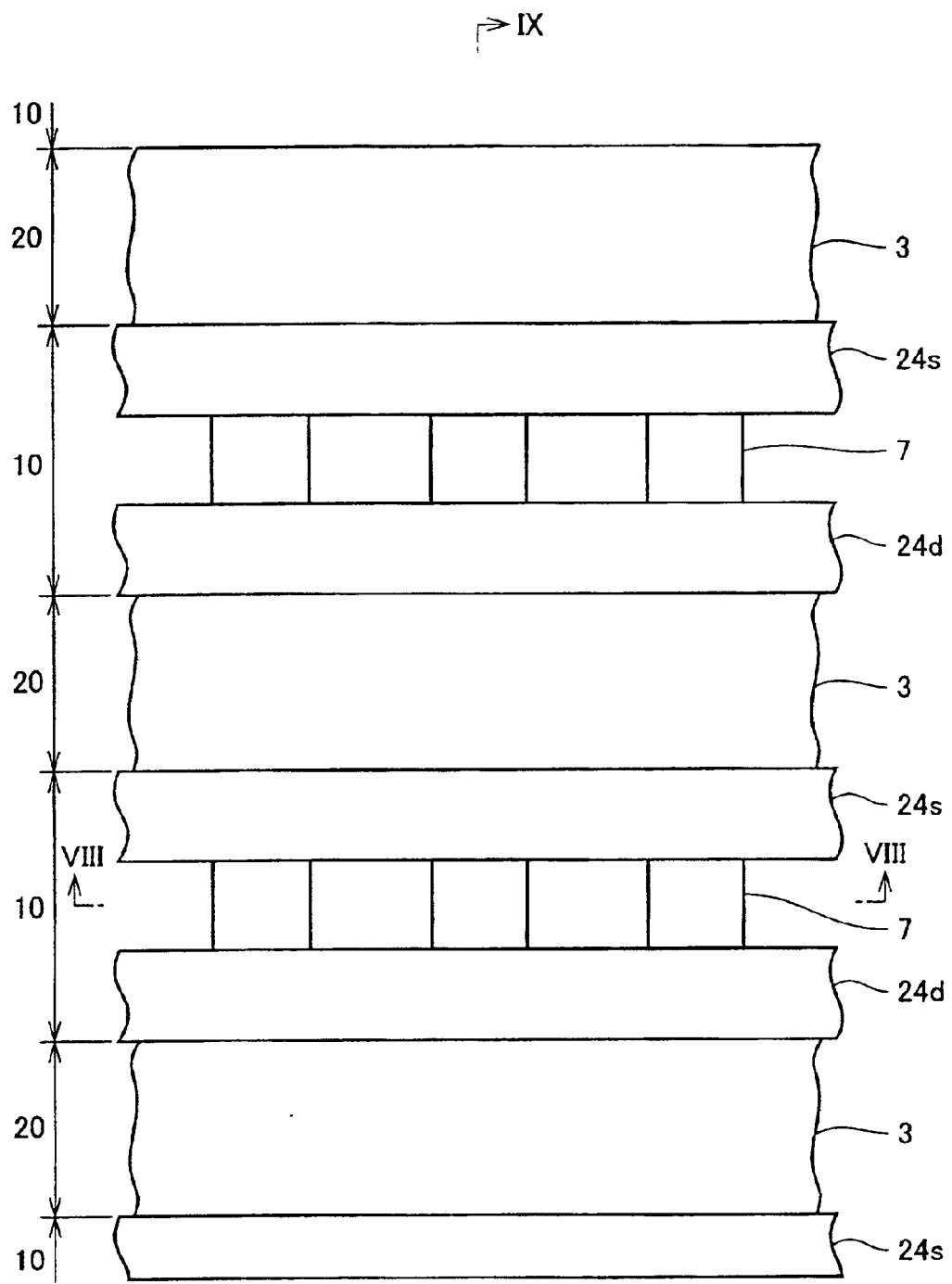
FIG. 7 is a plan view showing a second process of the method of fabricating the nonvolatile semiconductor memory device illustrated in FIGS. 1 to 3.
Figure 8:
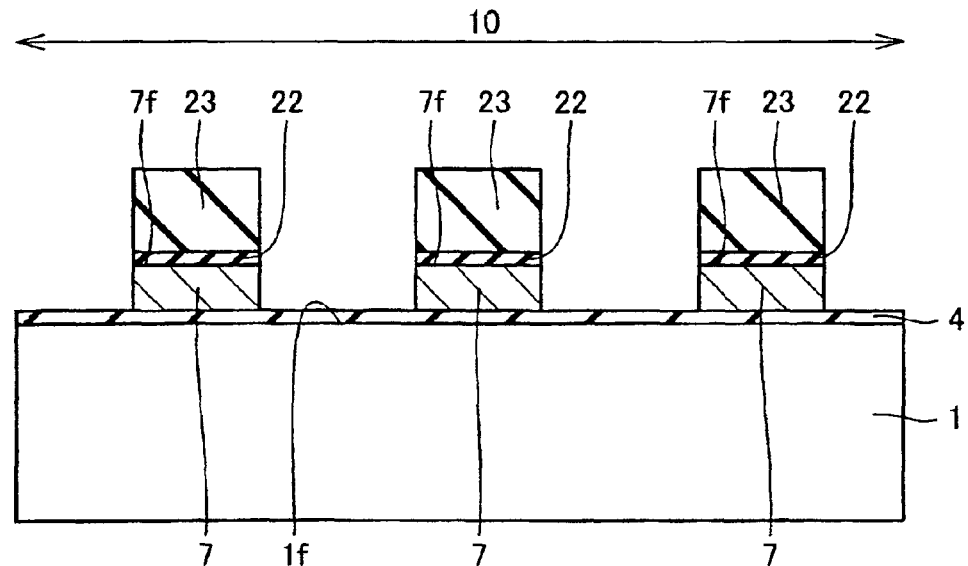
FIG. 8 is a cross section taken along line VIII—VIII of FIG. 7.
Figure 9:
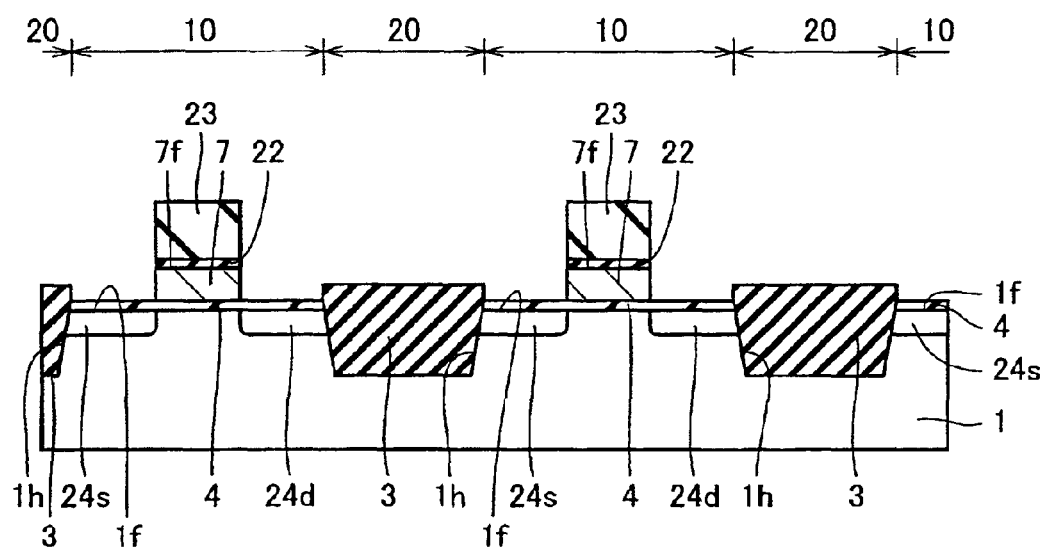
FIG. 9 is a cross section taken along line IX—IX of FIG. 7.

Referring to FIGS. 7 to 9, a resist pattern (not shown) is formed on mask layer 23. By using the resist pattern as a mask, mask layer 23, silicon oxide film 22, and band-shaped conductive layer 25 are etched. In such a manner, lower conductive layer 7 in the island shape is formed. The thickness of lower conductive layer 7 is 100 nm.

Figure 10:
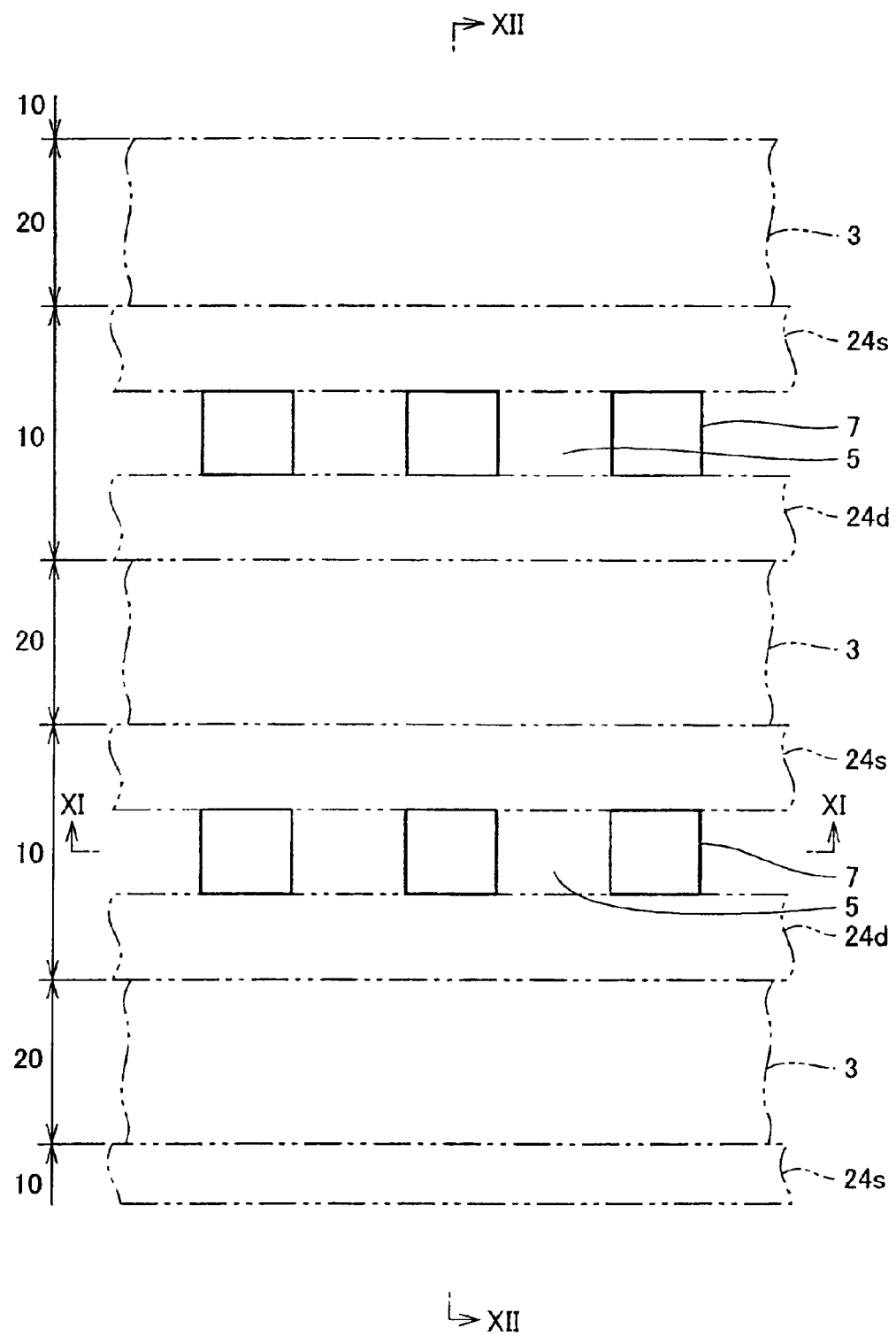
FIG. 10 is a plan view showing a third process of the method of fabricating the nonvolatile semiconductor memory device illustrated in FIGS. 1 to 3.
Figure 11:
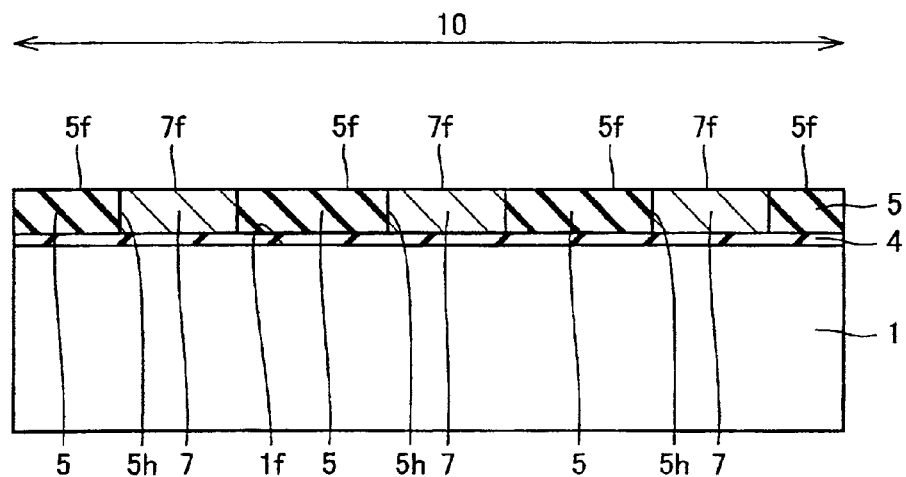
FIG. 11 is a cross section taken along line XI—XI of FIG. 10.
Figure 12:
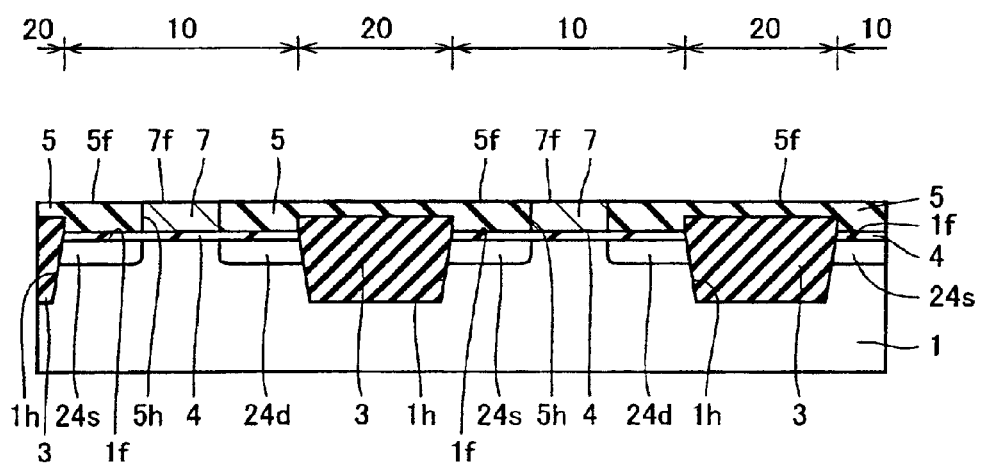
FIG. 12 is a cross section taken along line XII—XII of FIG. 10.

Referring to FIGS. 10 to 12, after removing silicon oxide film 22 and mask layer 23, a silicon oxide film having a thickness of 500 nm is formed on silicon substrate 1 by using TEOS as a material. The silicon oxide film is polished by CMP (Chemical Mechanical Polishing) to form interlayer insulating film 5 and to expose the top face 7f of lower conductive layer 7. At this time, the top face 7f of lower conductive layer 7 and the top face 5f of interlayer insulating film 5 become flush with each other.

Figure 13:
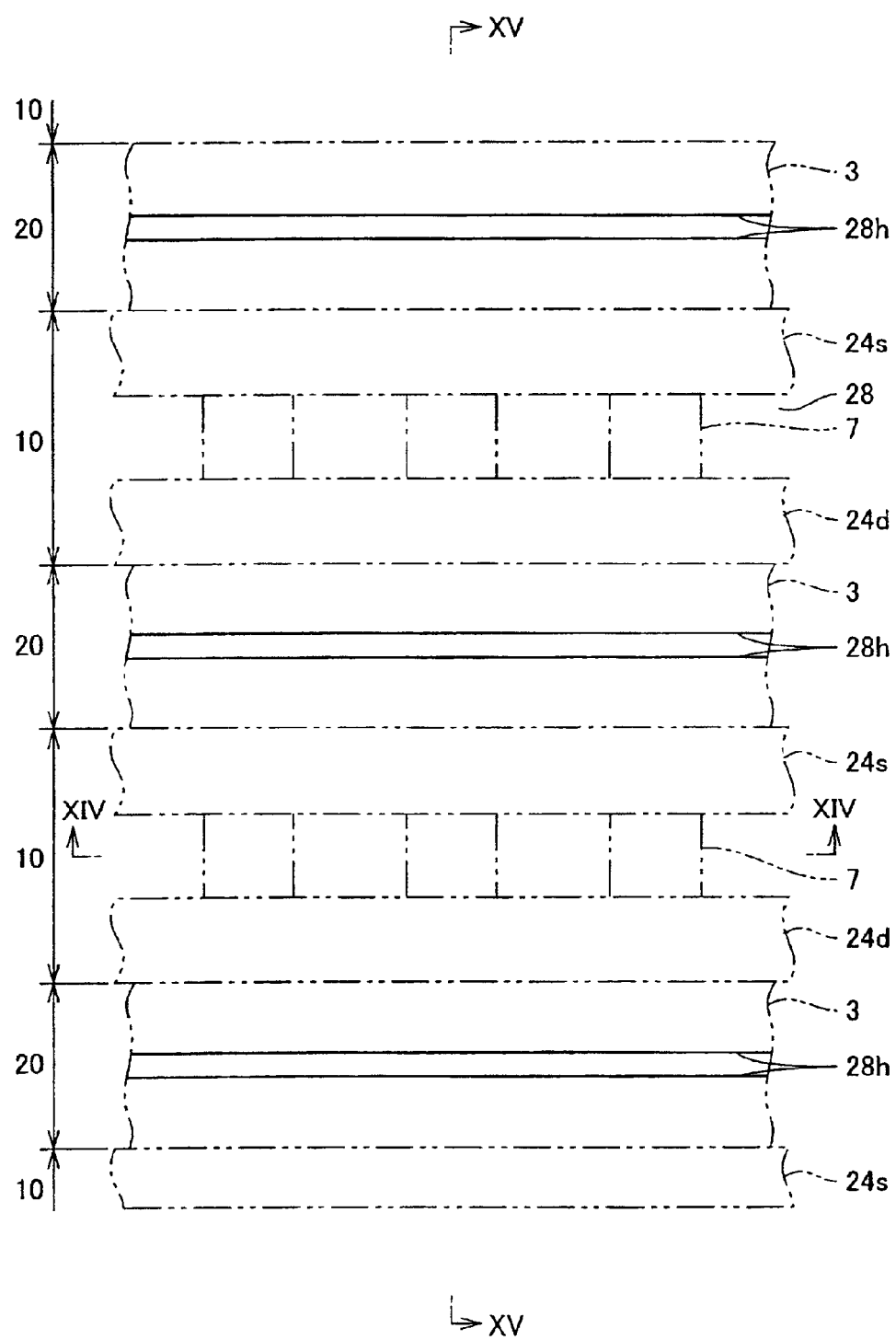
FIG. 13 is a plan view showing a fourth process of the method of fabricating the nonvolatile semiconductor memory device shown in FIGS. 1 to 3.
Figure 14:
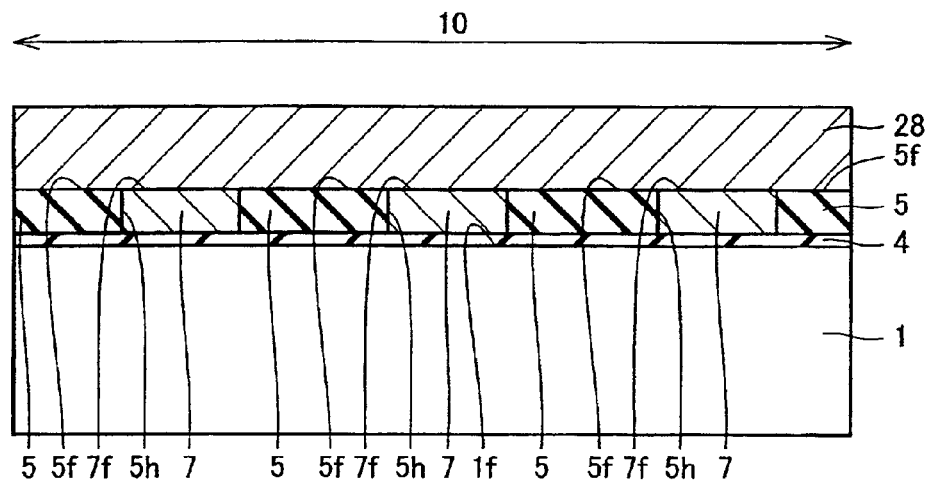
FIG. 14 is a cross section taken along line XIV—XIV of FIG. 13.
Figure 15:
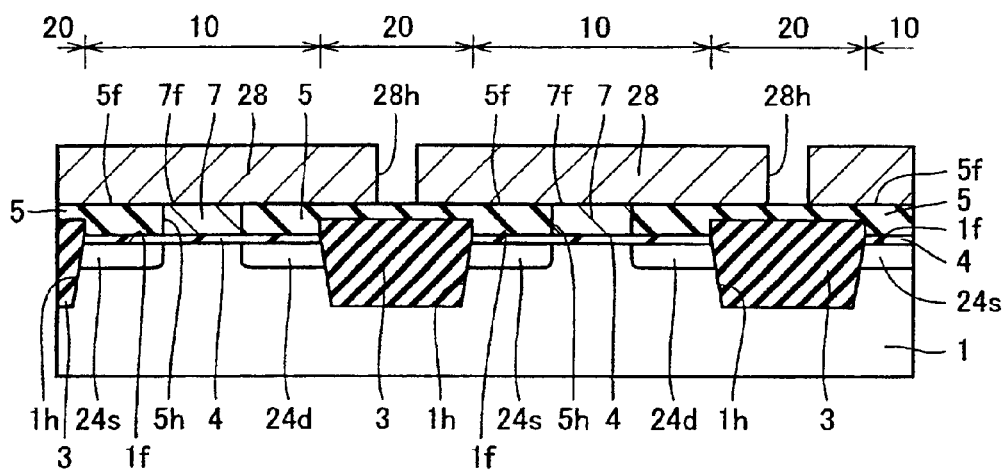
FIG. 15 is a cross section taken along line XV—XV of FIG. 13.

Referring to FIGS. 13 to 15, a doped polysilicon film 28 having a thickness of about 150 nm is formed on first interlayer insulating film 5 and lower conductive layer 7. A resist pattern (not shown) is formed on doped polysilicon film 28 and, by using the resist pattern as a mask, doped polysilicon film 28 is etched, thereby forming trenches 28h. As shown in FIG. 13, trench 28h is formed so as to extend in parallel with source region 24s and drain region 24d.

Figure 16:
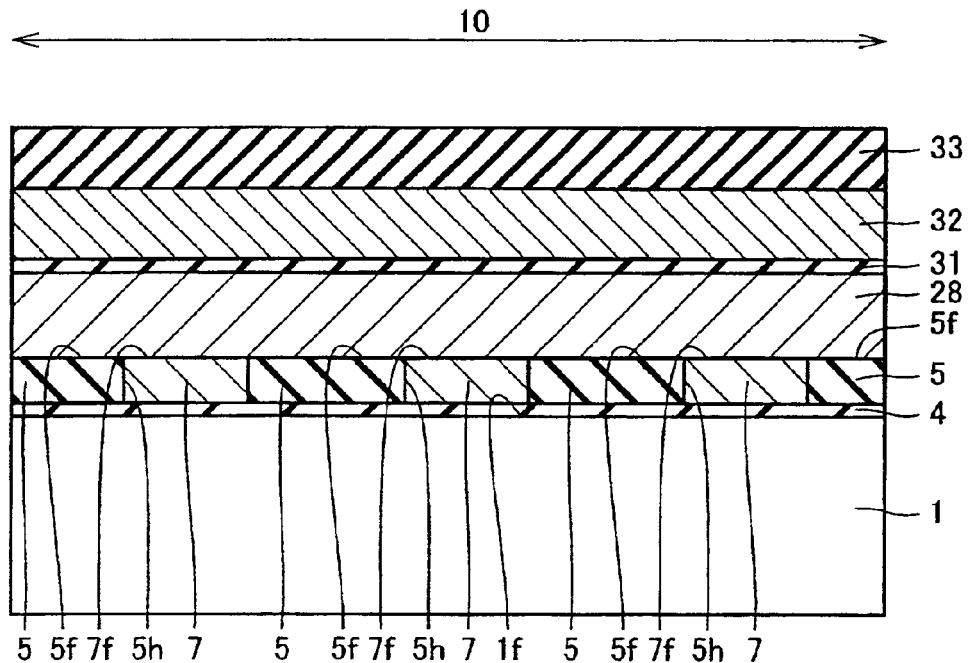
FIG. 16 is a cross section showing a fifth process of the method of fabricating the nonvolatile semiconductor memory device illustrated in FIGS. 1 to 3, which corresponds to the cross section of FIG. 2.
Figure 17:
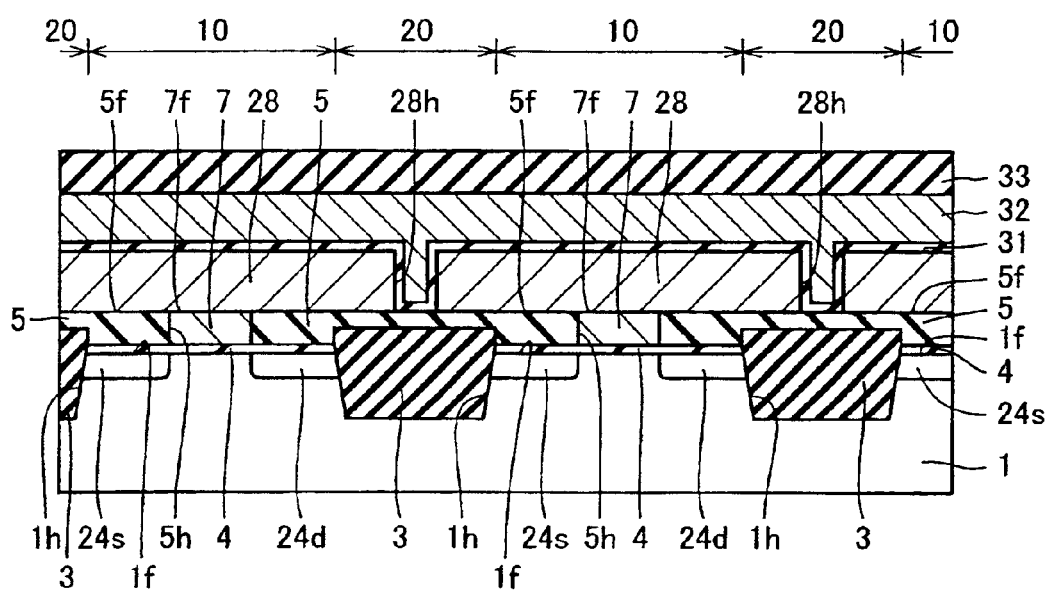
FIG. 17 is a cross section showing a fifth process of the method of fabricating the nonvolatile semiconductor memory device illustrated in FIGS. 1 to 3, which corresponds to the cross section of FIG. 3.

Referring to FIGS. 16 and 17, a dielectric film 31 which is constructed by a silicon oxide film, a silicon nitride film, and a silicon oxide film is formed on doped polysilicon film 28. At this time, dielectric film 31 is formed along trench 28h. A conductive film 32 having a two-layer structure of doped polysilicon and tungsten silicide is formed on dielectric film 31. A silicon oxide film 33 made of TEOS as a material is formed on conductive film 32.

Figure 18:
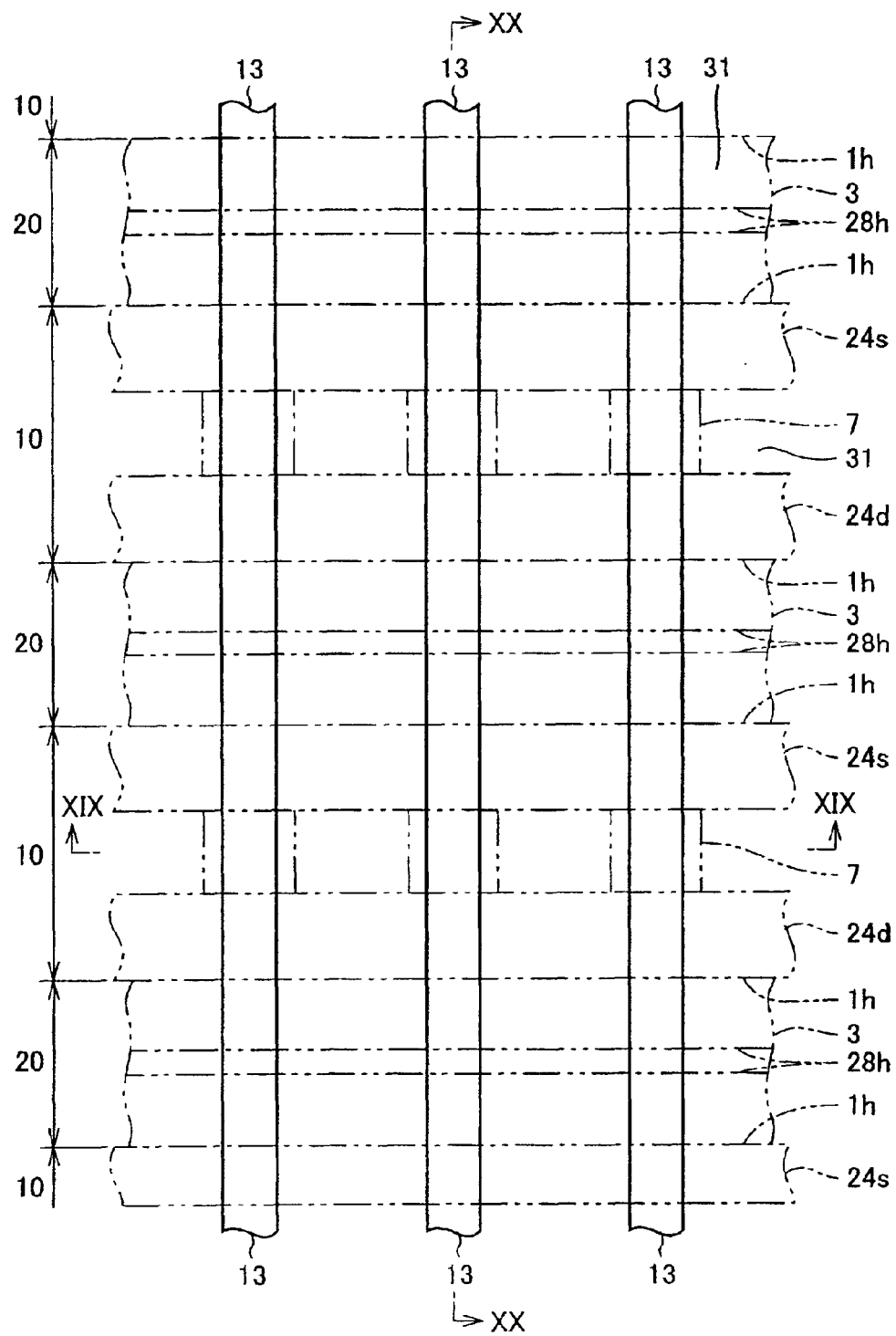
FIG. 18 is a plan view showing a sixth process of the method of fabricating the nonvolatile semiconductor memory device illustrated in FIGS. 1 to 3.
Figure 19:
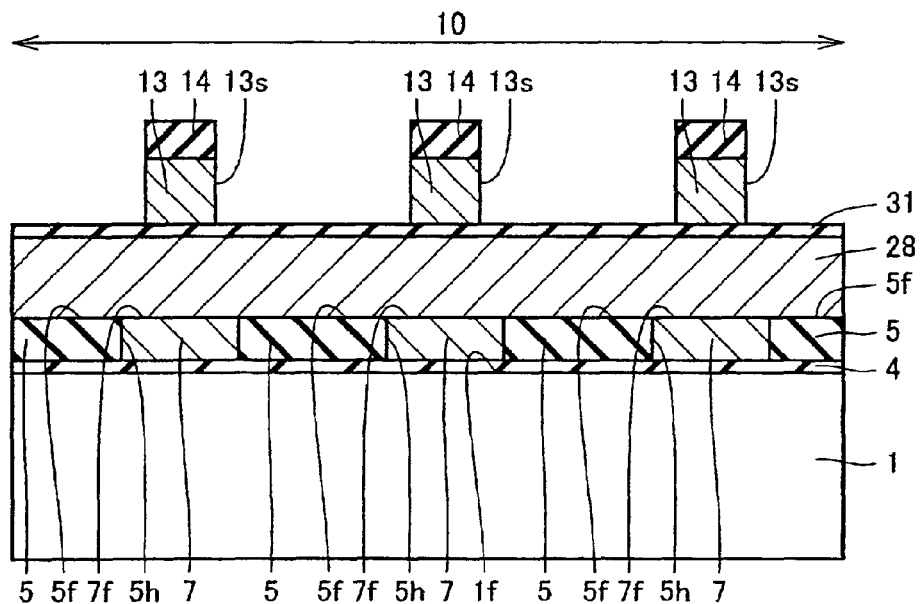
FIG. 19 is a cross section taken along line XIX—XIX of FIG. 18.
Figure 20:
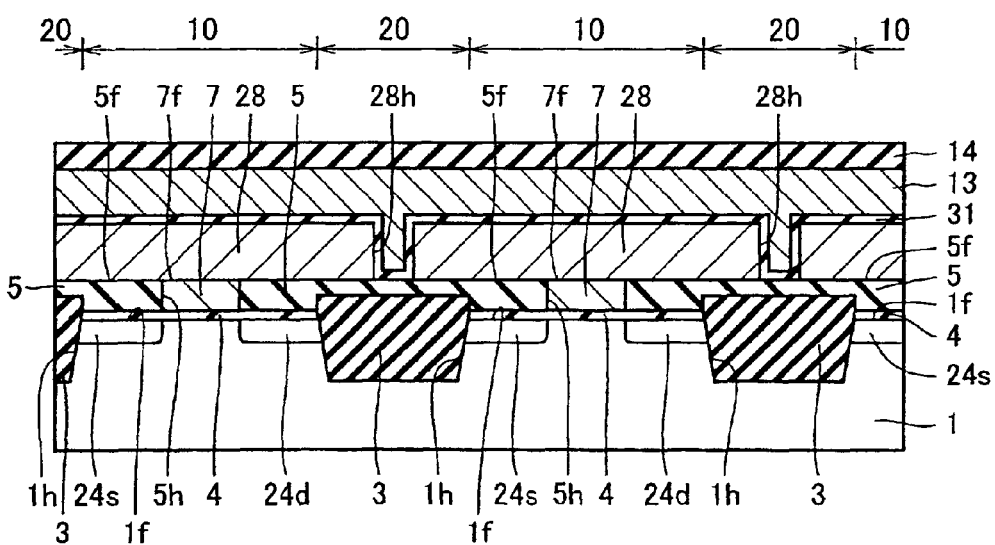
FIG. 20 is a cross section taken along line XX—XX of FIG. 18.

Referring to FIGS. 18 to 20, a resist pattern is formed on silicon oxide film 33, and silicon oxide film 33 is etched along the resist pattern, thereby forming mask layer 14. By using mask layer 14 as a mask, conductive film 32 is etched, thereby forming control gate electrode 13.

Figure 21:
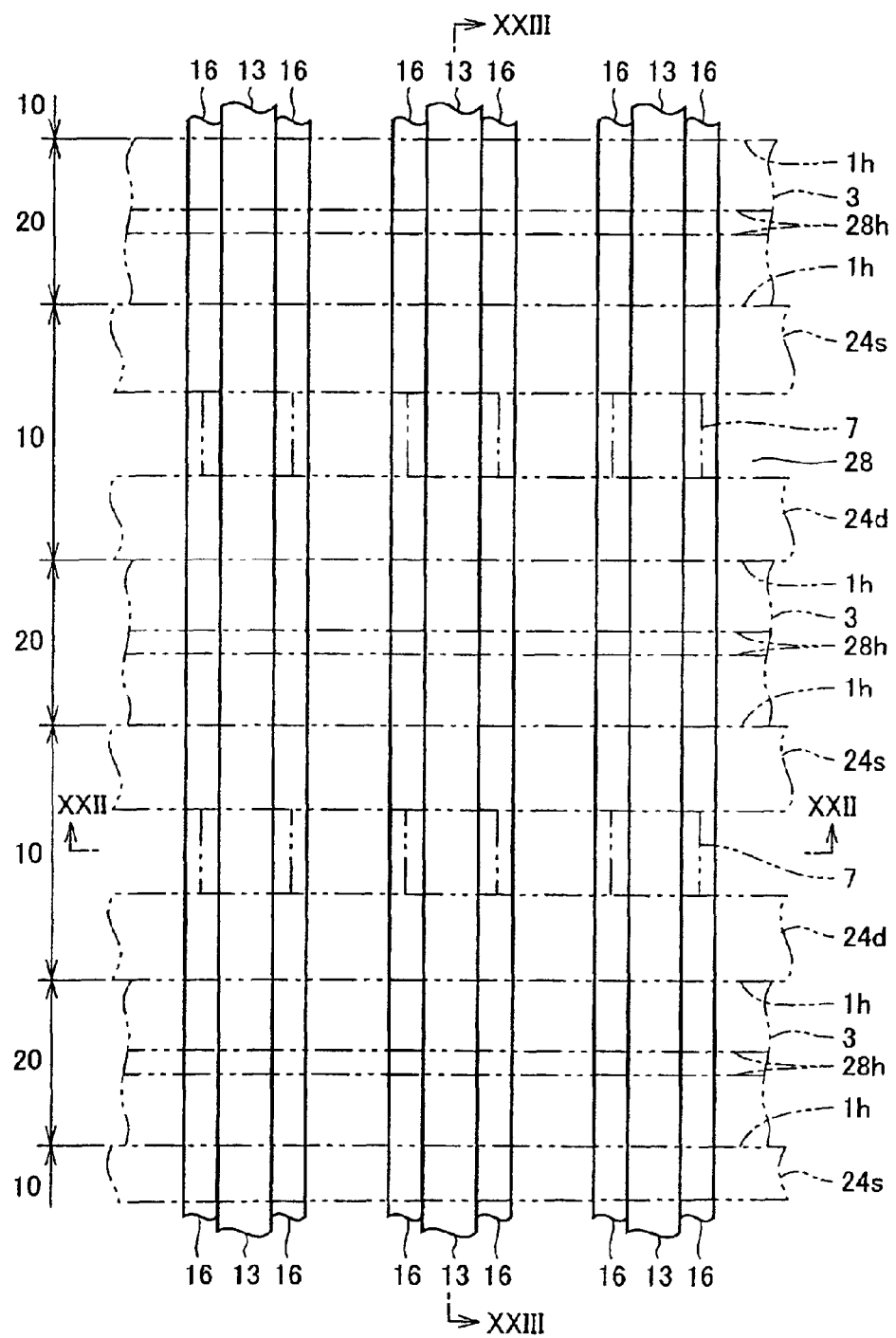
FIG. 21 is a plan view showing a seventh process of the method of fabricating the nonvolatile semiconductor memory device illustrated in FIGS. 1 to 3.
Figure 22:
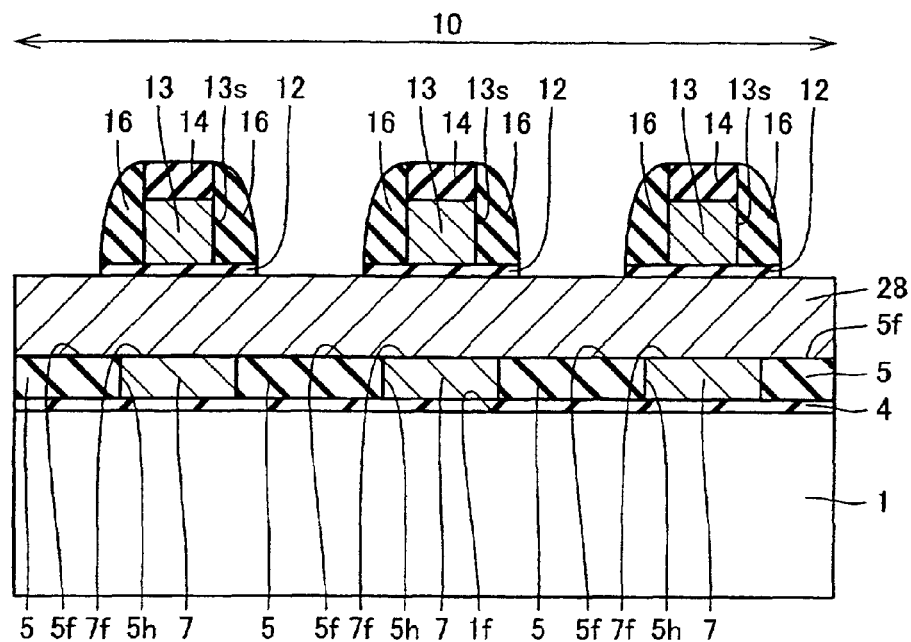
FIG. 22 is a cross section taken along line XXII—XXII of FIG. 21.
Figure 23:
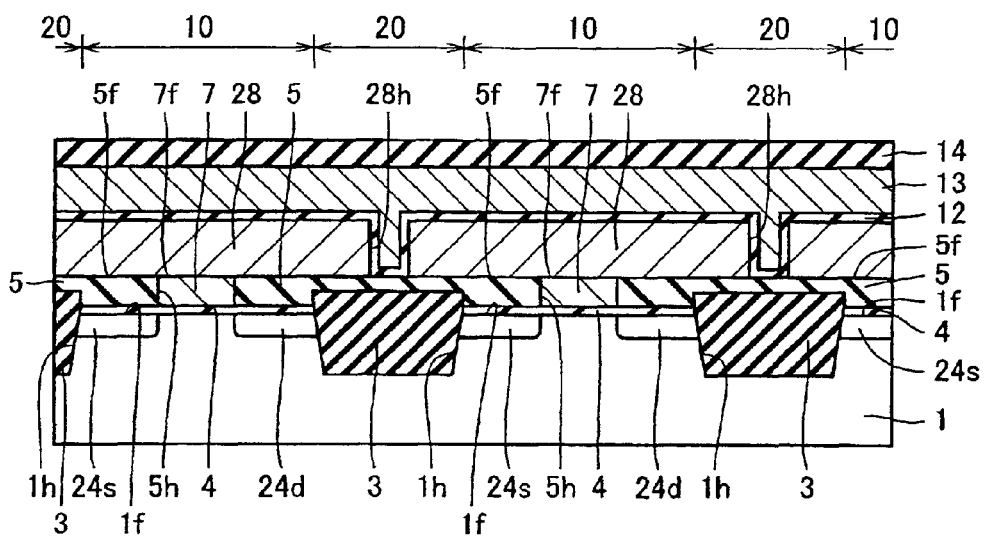
FIG. 23 is a cross section taken along line XXIII—XXIII of FIG. 21.

Referring to FIGS. 21 to 23, a silicon oxide film is formed by using TEOS as a material so as to cover control gate electrode 13 and mask layer 14. By etching back the whole silicon oxide film, side wall insulating layer 16 is formed on side walls 13s of control gate electrode 13. Side wall insulating layer 16 extends in the same direction as control gate electrode 13.

Referring to FIGS. 1 to 3, doped polysilicon film 28 is etched by using side wall insulating layer 16 and mask layer 14 as a mask, thereby constructing upper conductive layer 8. Second interlayer insulating film 41 is formed so as to cover control gate electrode 13, thereby completing the nonvolatile semiconductor memory device shown in FIGS. 1 to 3.

In such a nonvolatile semiconductor memory device, first, lower conductive layer 7 is formed and, then, upper conductive layer 8 and control gate electrode 13 are formed. Consequently, lower conductive layer 7 can be formed with precision, and the precision of floating gate electrode 9 is improved. Further, the width W1 in the channel width direction of lower conductive layer 7 is narrower than the width W2 in the channel width direction of upper conductive layer 8, thereby enabling occurrence of a disturbance phenomenon of writing data to neighboring memory cells to be prevented.

Second Embodiment

Figure 24:
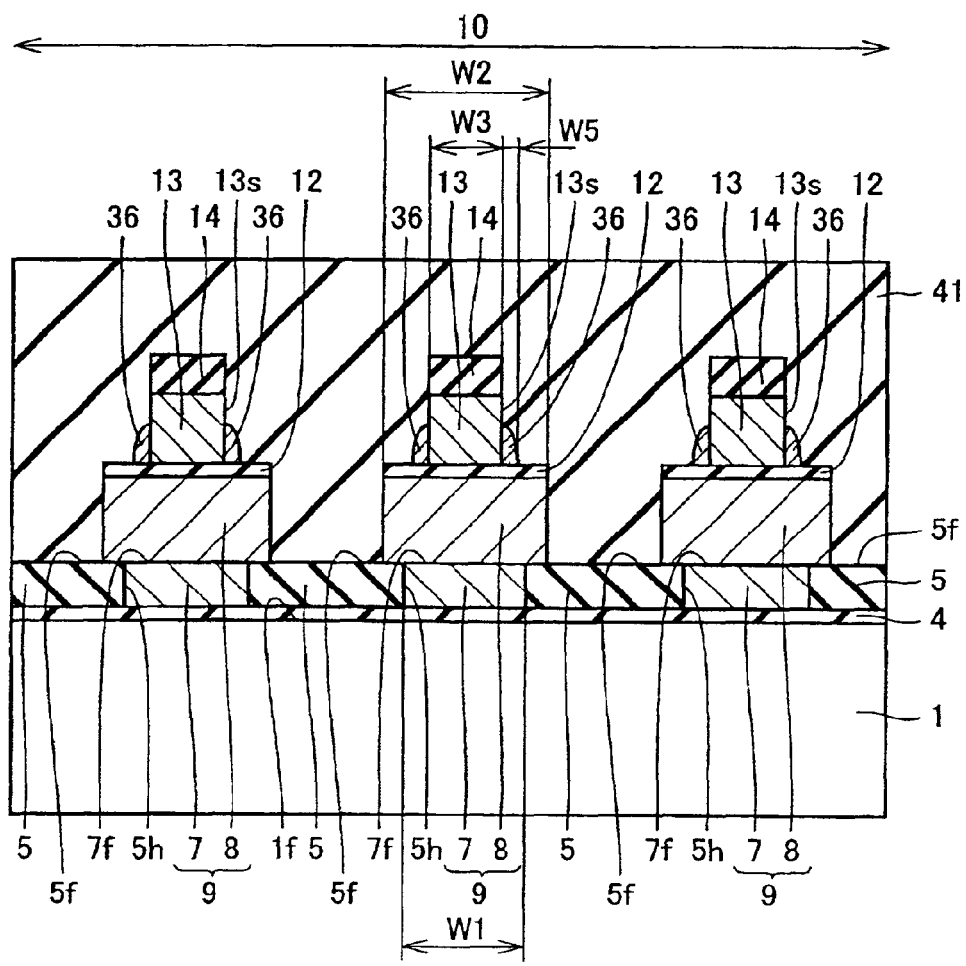
FIG. 24 is a cross section of a nonvolatile semiconductor memory device according to a second embodiment of the invention.

FIG. 24 is a cross section taken in the same direction as FIG. 2, which is the channel width direction. Referring to FIG. 24, a nonvolatile semiconductor memory device according to a second embodiment of the invention is different from the nonvolatile semiconductor memory device according to the first embodiment with respect to a point that a side wall conductive layer 36 is formed on side walls 13s of control gate electrode 13. Side wall conductive layer 36 is made of doped polysilicon. The nonvolatile semiconductor memory device according to the second embodiment is formed so as to have the same cross section as that of FIG. 3.

Figure 25:
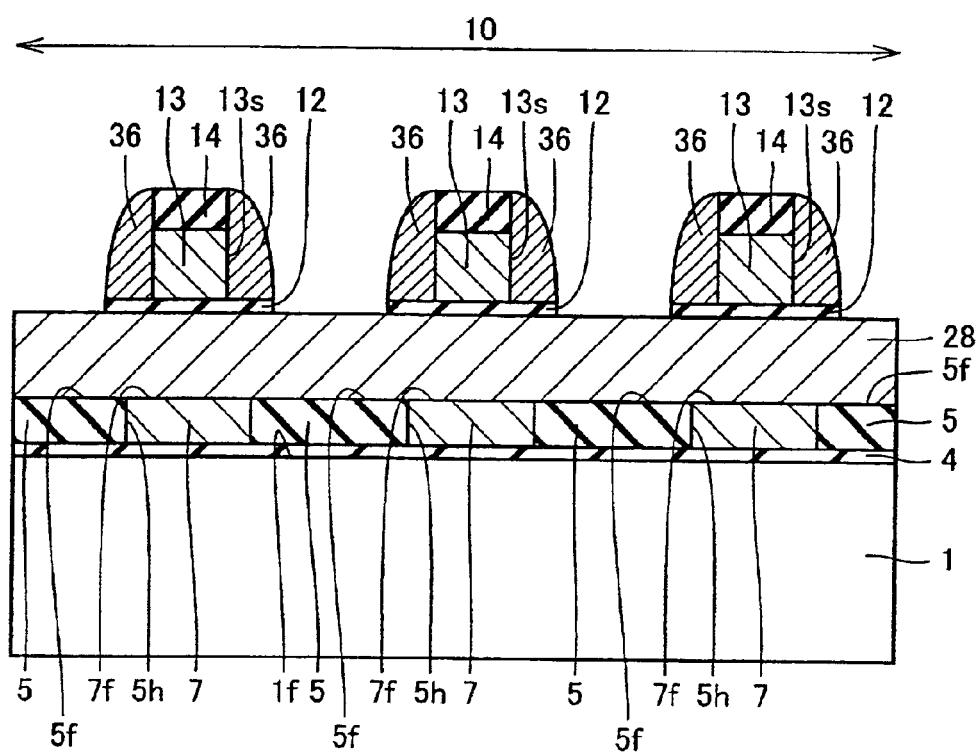
FIG. 25 is a cross section showing a method of fabricating the nonvolatile semiconductor memory device illustrated in FIG. 24.

A method of fabricating the nonvolatile semiconductor memory device shown in FIG. 24 will now be described. The cross section of FIG. 25 corresponds to a process shown in FIG. 22. Referring to FIG. 25, a doped polysilicon film is formed so as to cover control gate electrode 13. By etching back the whole doped polysilicon film, side wall conductive layer 36 is formed. After that, by processes similar to those of the first embodiment, the nonvolatile semiconductor memory device shown in FIG. 24 is completed.

The nonvolatile semiconductor memory device according to the second embodiment has an effect similar to that of the nonvolatile semiconductor memory device according to the first embodiment. Further, since side wall conductive layer 36 made of conductive doped polysilicon is formed on side walls 13s of control gate electrode 13, side wall conductive layer 36 also acts as a control gate electrode. As a result, the cross sectional area of the control gate electrode increases, so that electric resistance can be reduced.

Third Embodiment

Figure 26:
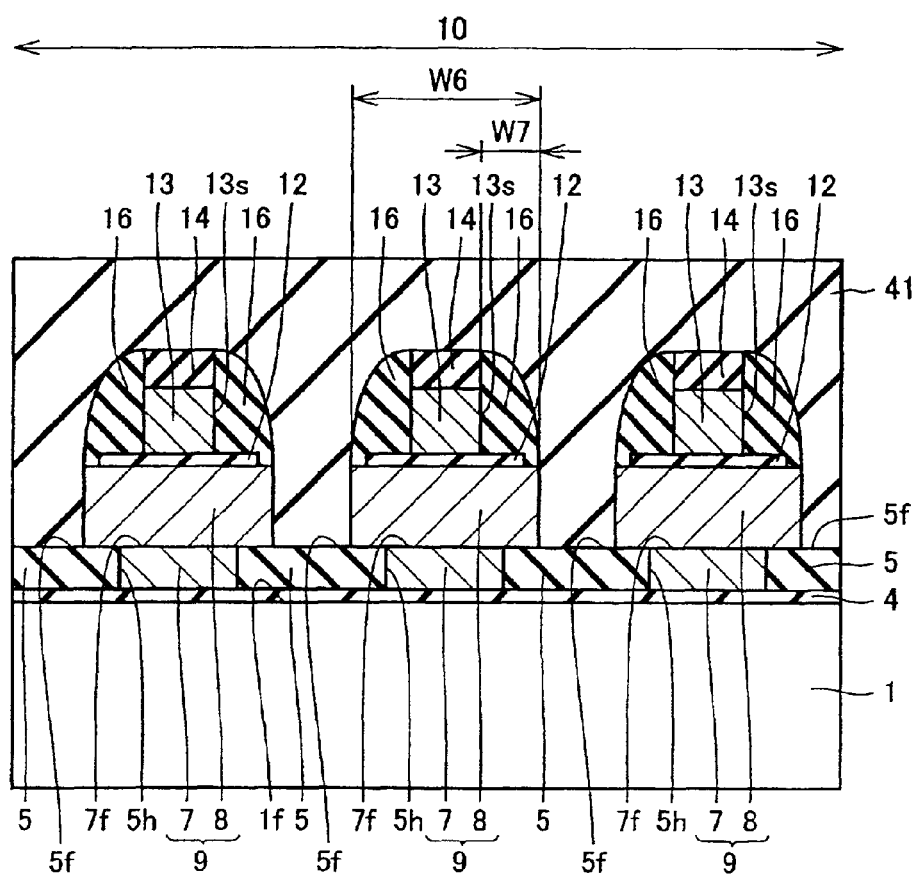
FIG. 26 is a cross section of the nonvolatile semiconductor memory device according to a third embodiment of the invention.

The cross section shown in FIG. 26 corresponds to the cross section shown in FIG. 2, which is the cross section taken in the channel width direction. Referring to FIG. 26, in a nonvolatile semiconductor memory device according to a third embodiment of the invention, a width W7 of side wall insulating layer 16 is wider than the width W4 of side wall insulating layer 16 in the first embodiment. Accordingly, a width W6 of upper conductive layer 8 formed under side wall insulating layer 16 is wider than the width 2 of upper conductive layer 8 of the first embodiment.

Figure 27:
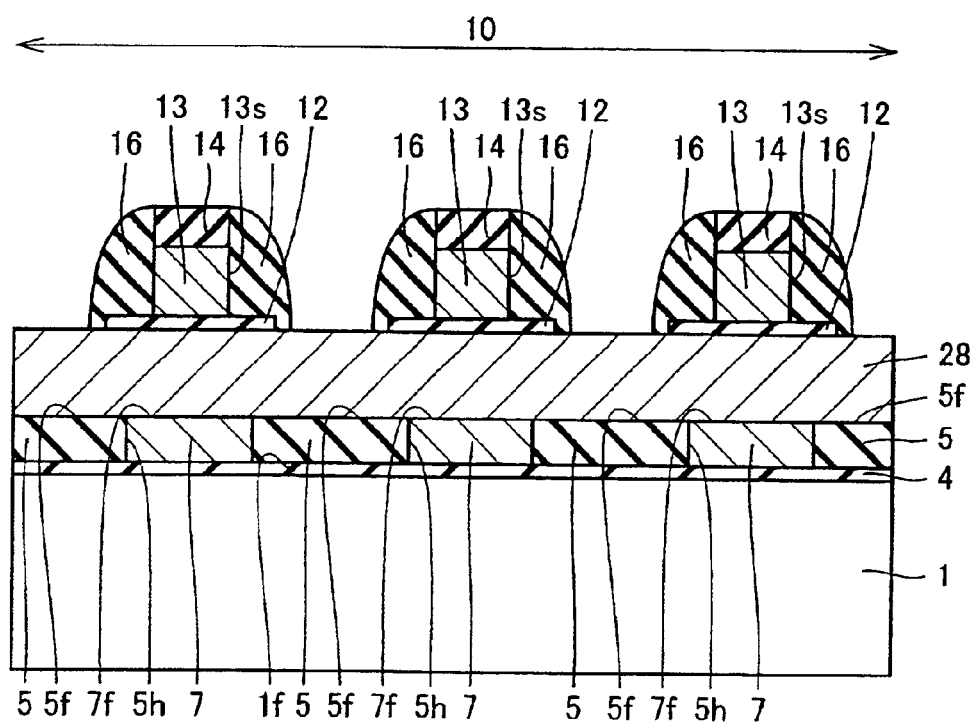
FIG. 27 is a cross section showing a method of fabricating the nonvolatile semiconductor memory device illustrated in FIG. 26.
Figure 28:
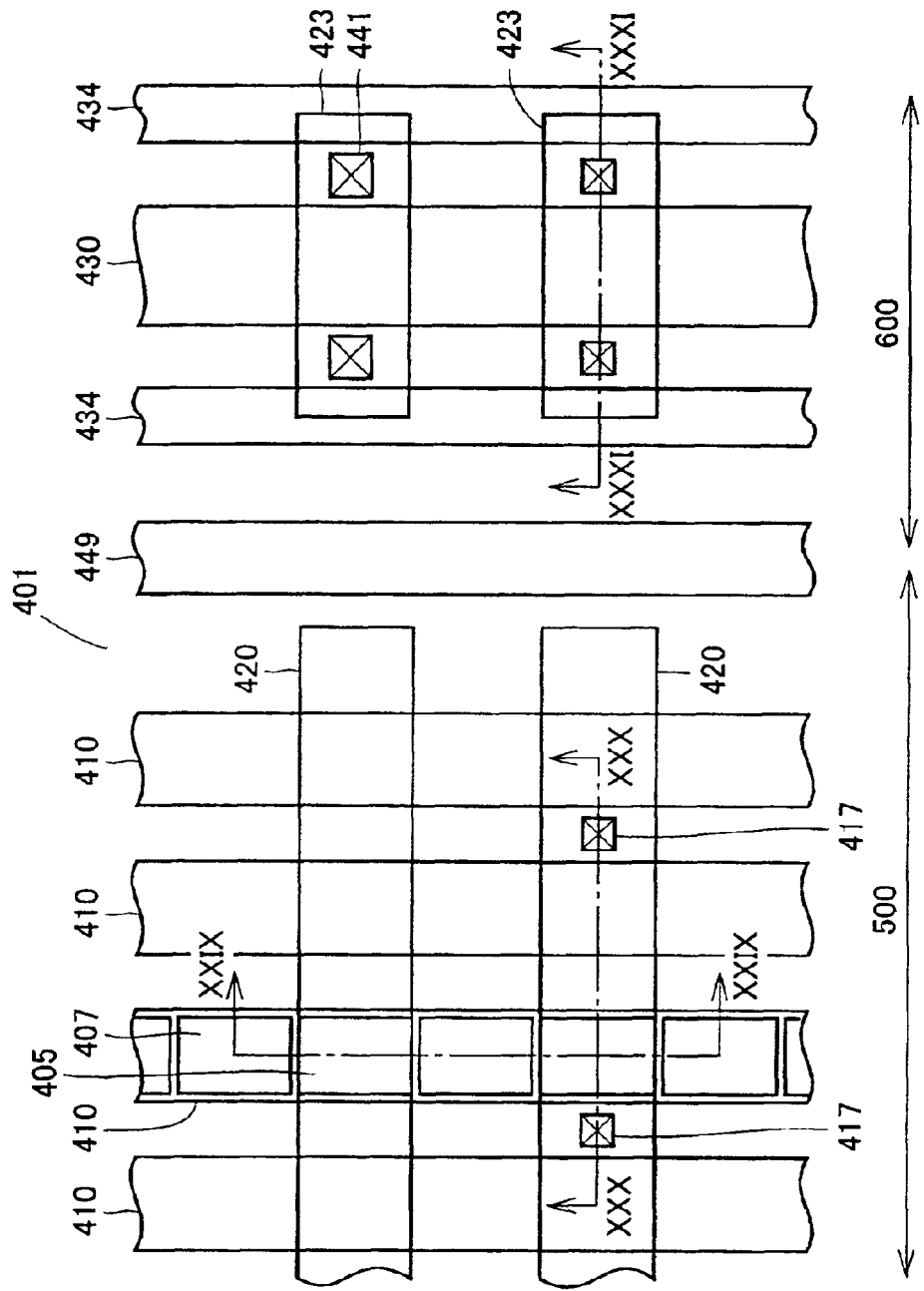
FIG. 28 is a plan view of a conventional nonvolatile semiconductor memory device.
Figure 29:
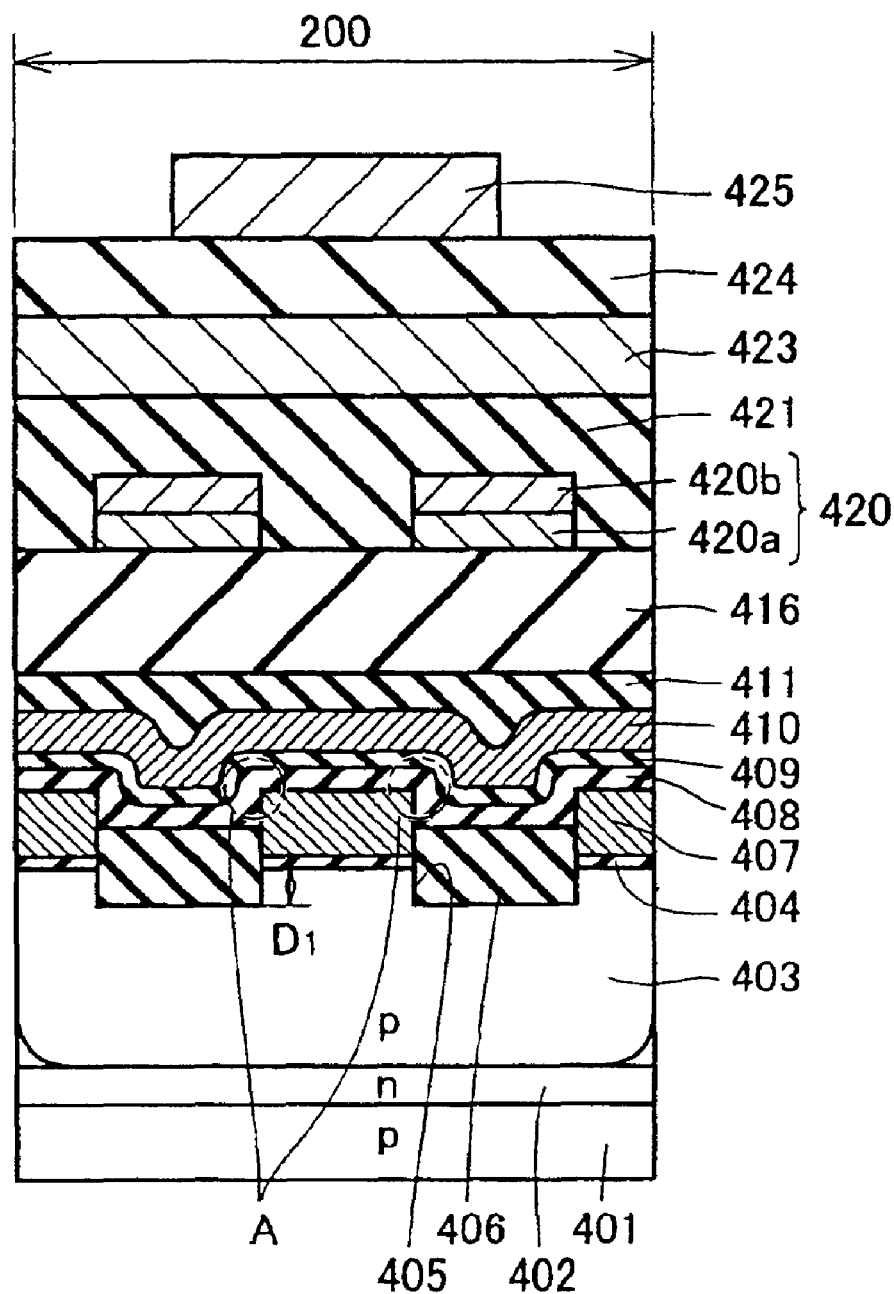
FIG. 29 is a cross section taken along line XXIX—XXIX of FIG. 28.
Figure 30:
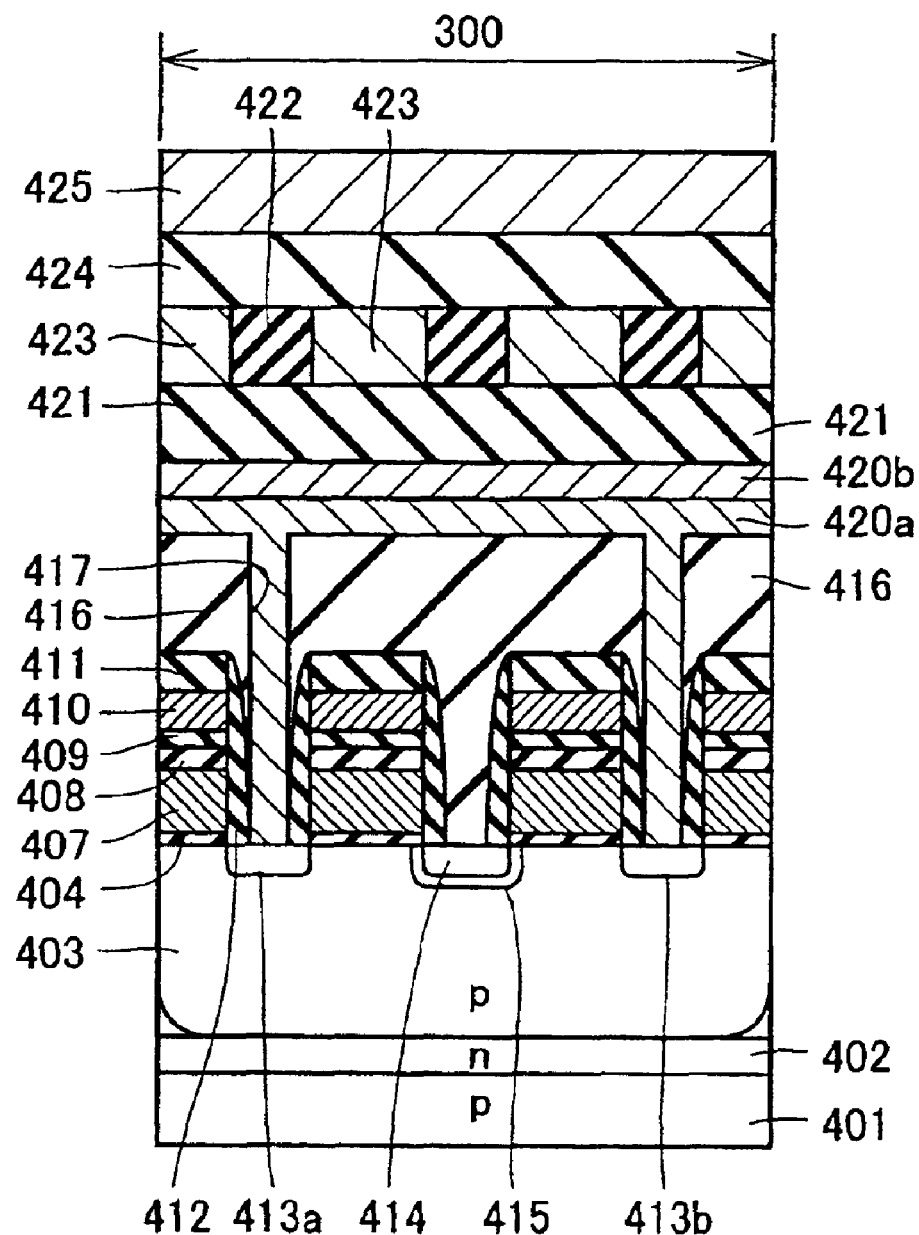
FIG. 30 is a cross section taken along line XXX—XXX of FIG. 28.
Figure 31:
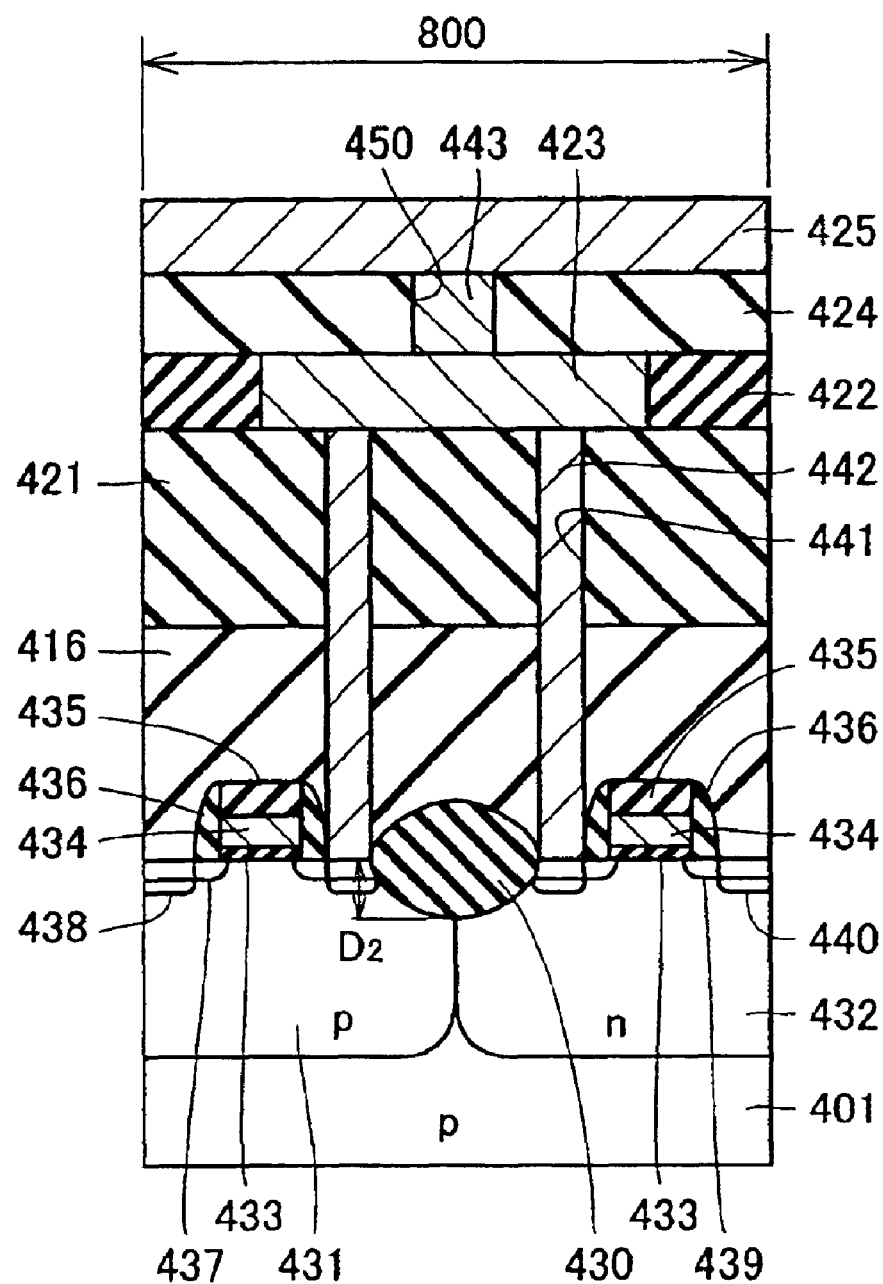
FIG. 31 is a cross section taken along line XXXI—XXXI of FIG. 28.
Figure 32:
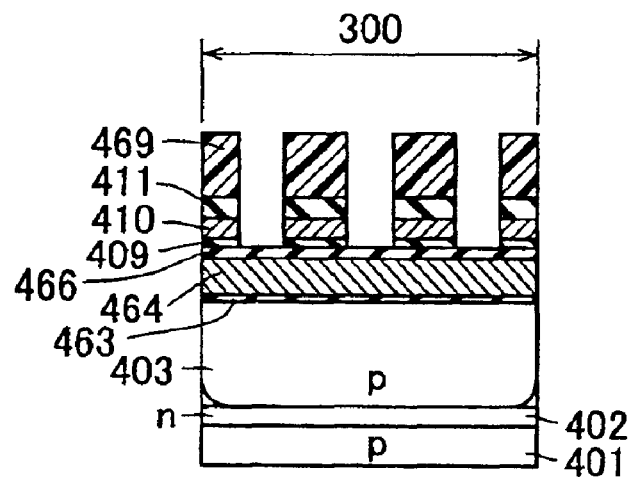
FIG. 32 is a cross section showing a first process of the method of fabricating the nonvolatile semiconductor memory device illustrated in FIGS. 28 to 31.
Figure 33:
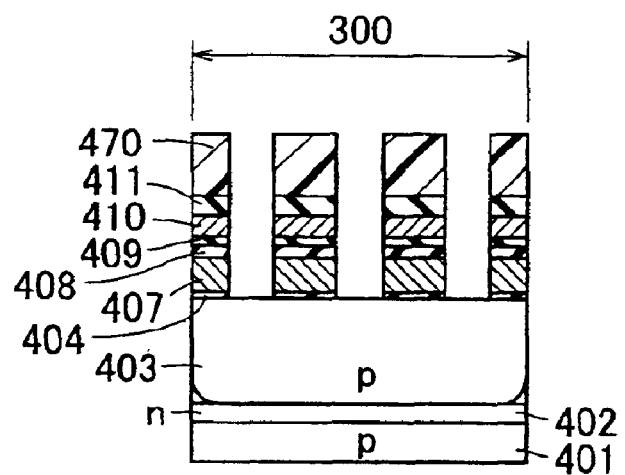
FIG. 33 is a cross section showing a second process of the method of fabricating the nonvolatile semiconductor memory device illustrated in FIGS. 28 to 31.

A method of fabricating the nonvolatile semiconductor memory device shown in FIG. 26 will now be described. Referring to FIG. 27, after the process shown in FIG. 22 of the first embodiment, a silicon oxide film made of TEOS as a material is formed again so as to cover side wall insulating layer 16. By etching back the whole silicon oxide film, side wall insulating layer 16 is widened. After that, by performing the processes in a manner similar to the first embodiment, the nonvolatile semiconductor memory device shown in FIG. 26 is completed.

The nonvolatile semiconductor memory device according to the third embodiment also produces an effect similar to that of the nonvolatile semiconductor memory device according to the first embodiment.

Since the side wall insulating layer can be formed wide, a margin to a deviation which occurs when control gate electrode 13 is formed by photoengraving can be widened.

Although the embodiments of the invention have been described above, the embodiments can be variously modified. The nonvolatile semiconductor memory device of the third embodiment can be used as an EEPROM (electrically erasable programmable read-only memory), flash memory, or the like. Further, as the material of the control gate electrode 13 and floating gate electrode 9, various conductive materials can be used. Side wall insulating layer 16 may be constructed by a silicon nitride film.

According to the invention, the nonvolatile semiconductor memory device whose floating gate electrode is fabricated with precision can be provided.

According to the invention, the nonvolatile semiconductor memory device capable of preventing the disturbance phenomenon of the floating gate electrode can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:
   a semiconductor substrate having a source region and a drain region with a channel length therebetween;
   a floating gate electrode formed on said semiconductor substrate with a gate insulating film interposed therebetween,
   said floating gate electrode including a lower conductive layer formed on said gate insulating film, and an upper conductive layer formed on said lower conductive layer, said lower conductive layer having a second length in a channel length direction, and said upper conductive layer having a third length longer than the second length in the channel length direction; and
   a control gate electrode formed on said floating gate electrode with a dielectric film interposed therebetween;
   wherein the width of said control gate electrode is narrower than the width of said lower conductive layer in the direction orthogonal to the channel length direction.

2. The nonvolatile semiconductor memory device according to claim 1, further comprising
   a side wall insulating layer formed on said dielectric film so as to be in contact with a side wall of said control gate electrode, wherein
   the width of said side wall insulating layer is narrowed with distance from said dielectric film.

3. The nonvolatile semiconductor memory device according to claim 1, further comprising
   a side wall conductive layer formed on said dielectric film so as to be in contact with a side wall of said control gate electrode, wherein
   the width of said side wall conductive layer is narrowed with distance from said dielectric film.

4. The nonvolatile semiconductor memory device according to claim 1, wherein
   said upper conductive layer and said lower conductive layer are made of the same material.

* * * * *